United States Patent
Yoshida et al.

(10) Patent No.: US 7,353,594 B2
(45) Date of Patent: Apr. 8, 2008

(54) COMPONENT MOUNTING METHOD

(75) Inventors: Noriaki Yoshida, Ikeda (JP); Osamu Okuda, Yamanashi (JP); Akira Kabeshita, Hirakata (JP); Takeyuki Kawase, Kofu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 45 days.

(21) Appl. No.: 11/232,993

(22) Filed: Sep. 23, 2005

(65) Prior Publication Data

US 2006/0016067 A1    Jan. 26, 2006

Related U.S. Application Data

(62) Division of application No. 10/129,005, filed as application No. PCT/JP00/07611 on Oct. 30, 2000, now Pat. No. 6,971,157.

(30) Foreign Application Priority Data

Nov. 5, 1999    (JP)    ................... 11-315158

(51) Int. Cl.
*H05K 3/30*    (2006.01)
(52) U.S. Cl. ............................ 29/833; 29/832; 29/834; 29/836; 29/721; 29/740; 294/64.1; 700/121; 700/213
(58) Field of Classification Search ............ 29/711, 29/720, 722, 729, 739–743, 832–834, 836, 29/721; 294/2, 64.1; 414/414, 737, 752.1; 700/115, 186, 213, 56–64, 121; 901/40, 901/46, 47
See application file for complete search history.

(56) References Cited

U.S. PATENT DOCUMENTS

| 5,442,566 | A | 8/1995 | Imafuku et al. | |
|---|---|---|---|---|
| 5,452,509 | A | 9/1995 | Suzuki et al. | |
| 5,743,005 | A | 4/1998 | Nakao et al. | |
| 5,778,525 | A * | 7/1998 | Hata et al. ..................... | 29/836 |
| 6,568,069 | B1 * | 5/2003 | Melf et al. ..................... | 29/740 |
| 6,588,096 | B1 * | 7/2003 | Hidese ........................ | 29/832 |
| 6,681,468 | B1 | 1/2004 | Uchiyama et al. | |
| 7,036,213 | B2 * | 5/2006 | Kabeshita et al. ............ | 29/740 |

FOREIGN PATENT DOCUMENTS

| EP | 0 854 670 | 7/1998 |
|---|---|---|
| JP | 62-169423 | 7/1987 |
| JP | 3-203296 | 9/1991 |
| JP | 6-83945 | 3/1994 |
| JP | 6-85500 | 3/1994 |
| JP | 2000-114785 | 4/2000 |

* cited by examiner

*Primary Examiner*—Minh Trinh
*Assistant Examiner*—Donghai D. Nguyen
(74) *Attorney, Agent, or Firm*—Wenderoth, Lind & Ponack, L.L.P.

(57) ABSTRACT

When two mounting units for performing a series of component mounting operations constituted of component holding, component recognition, and component placing are arranged, operational control is executed so that, while a component recognition or board recognition operation is performed in either one of the two mounting units, the component placing or component holding operation is not performed in the other of the mounting units.

14 Claims, 7 Drawing Sheets

COMPONENT MOUNTING METHOD

This application is a divisional of U.S. Ser. No. 10/129,005, filed May 1, 2002, now U.S. Pat. No. 6,971,157, which is a National Stage application of PCT/JP00/07611, filed Oct. 30, 2000.

TECHNICAL FIELD

The present invention relates to a component mounting apparatus and method for performing component holding, component recognition, and component placement in each of two regions divided from a component mounting work region in which component mounting is performed.

BACKGROUND ART

Conventionally, there have been known various types of structures of a component mounting apparatus and method. For example, there is one component mounting apparatus, which is provided with a component supply cassette for supplying components, a head section that has a suction nozzle for holding a component supplied from the component supply cassette, an X-Y robot for moving the head section, a recognition camera for recognizing the component held by the suction nozzle, and an X-Y table for holding a board on which the component recognized by the recognition camera and held by the suction nozzle is placed. The apparatus is constructed so as to hold the board by the X-Y table, thereafter hold the component received from the component supply cassette by virtue of the suction nozzle with the head section moved by driving the X-Y robot, recognize the component held by the suction nozzle by virtue of the recognition camera, and thereafter place the component held by the suction nozzle onto the board held by the X-Y table.

However, the above-mentioned structure is able to perform component mounting on only one board even if a plurality of suction nozzles are arranged, and there has been a demand for performing component mounting on a plurality of boards in order to increase a mounting tact (mounting time), or productivity.

Accordingly, it can be considered to arrange two component mounting apparatuses of the aforementioned construction connected together. However, an installation floor area is doubled, and productivity per unit area cannot be improved. Furthermore, when a component mounting operation is performed independently by two component mounting apparatuses and it is attempted to accurately perform a component recognizing operation in one component mounting apparatus, vibrations are disadvantageously transmitted to the apparatus in its entirety if a component placing operation is performed in the other component mounting apparatus, and this results in reducing recognition accuracy.

Accordingly, an object of the present invention is to solve the aforementioned issues and provide a component mounting apparatus and method capable of improving component recognition or board recognition accuracy while independently performing each component mounting operation, and improving productivity per unit area when two component mounting apparatuses are arranged for performing a series of component mounting operations constituted of component holding, component recognition, and component placement.

SUMMARY OF THE INVENTION

In order to achieve the aforementioned object, the present invention is constructed as follows.

According to a first aspect of the present invention, there is provided a component mounting apparatus wherein a component mounting work region for performing component mounting is divided into a first mounting region and a second mounting region across a boundary of a path in which a mounting base object is conveyed. A first mounting unit is arranged in the first mounting region, and a second mounting unit is arranged in the second mounting region.

The first mounting unit comprises:
a first component supplying device for supplying a first component;
a first head section having a first component holding member for holding the first component when supplied from the first component supplying device;
a first component recognizing device for recognizing the first component while held by the first component holding member;
a first mounting base object holding device for holding a first mounting base object, which is recognized by the first component recognizing device, held by the first mounting base object holding device, and loaded into the first mounting region and on which the first component is to be placed; and
a first head section moving device for moving the first head section between the first component supplying device, the first component recognizing device, and the first mounting base object holding device.

The second mounting unit comprises:
a second component supplying device for supplying a second component;
a second head section having a second component holding member for holding the second component when supplied from the second component supplying device;
a second component recognizing device for recognizing the second component while held by the second component holding member;
a second mounting base object holding device for holding a second mounting base object, which is recognized by the second component recognizing device, held by the second mounting base object holding device, and loaded into the second mounting region through the first mounting region and on which the second component is to be placed; and
a second head section moving device for moving the second head section between the second component supplying device, the second component recognizing device, and the second mounting base object holding device.

The Component Mounting Apparatus Comprises:
an individual operation control section for executing control to: load the first mounting base object into the first mounting base object holding device in the first mounting region; hold the first mounting base object by the first mounting base object holding device; thereafter move the first head section by driving the first head section moving device so as to hold the first component, when received from the first component supplying device, by the first component holding member; recognize the first component, while held by the first component holding member, by the first component recognizing device; thereafter place the first component held by the first component holding member onto the first mounting base object held by the first mounting base object holding device; load the second mounting base object into the second mounting base object holding device in the second mounting region via the first mounting region; hold the second mounting base object by the second mounting base object holding device; thereafter move the second head section by driving the second head section moving device so as to hold the second component, when received from the second component supplying device, by the second component holding member; recognize the second component, while held by the second component holding member, by the second component recognizing device; and thereafter place the second component held by the second component holding member onto the second mounting base object held by the second mounting base object holding device; and a reciprocal operation control section for executing, when operation of either one of the first and second mounting units is performed, operational control of the operation in the one mounting unit and operation in the other mounting unit if the operation in the other mounting unit exerts an unfavorable influence on the operation in the one mounting unit.

According to a second aspect of the present invention, there is provided a component mounting apparatus as defined in the first aspect, wherein, while a component recognizing operation is performed in either one of the first and second mounting units, the reciprocal operation control section is operable for not performing a component mounting or component holding operation in the other of the first and second mounting units.

According to a third aspect of the present invention, there is provided a component mounting apparatus as defined in the first or second aspect, wherein the first mounting unit further comprises a first mounting base object recognizing device for recognizing the first mounting base object while held by the first mounting base object holding device, wherein the second mounting unit comprises a second mounting base object recognizing device for recognizing the second mounting base object while held by the second mounting base object holding device, and wherein the reciprocal operation control section can execute operational control, while a mounting base object recognizing operation is performed in either one of the first and second mounting units, so as not to perform a component placement or component holding operation in the other of the first and second mounting units.

According to a fourth aspect of the present invention, there is provided a component mounting apparatus as defined in any one of the first through third aspects, wherein the reciprocal operation control section can execute operational control, while a placement operation for placing a C4 component, as a component to be mounted, is performed in either one of the first and second mounting units, so as not to perform a component placement or component holding operation in the other of the first and second mounting units.

According to a fifth aspect of the present invention, there is provided a component mounting apparatus as defined in any one of the first through third aspects, wherein the reciprocal operation control section can execute operational control, while a recognizing operation is performed in either one of the first and second mounting units, so as not to perform a component placement or component holding operation in the other of the first and second mounting units by accelerating or decelerating an operating speed, in regions before and after a component placement operation or before and after a component holding operation in the other of the first and second mounting units, to be within a range in which no influence is exerted on the recognizing operation during the recognizing operation in the one of the first and second mounting units.

According to a sixth aspect of the present invention, there is provided a component mounting apparatus as defined in any one of the first through third aspects, wherein the reciprocal operation control section can execute operational control, while a recognizing operation is performed in either one of the first and second mounting units, so as not to perform a component placement or component holding operation by stopping operation in the other of the first and second mounting units.

According to a seventh aspect of the present invention, there is provided a component mounting apparatus as defined in the fourth aspect, wherein the reciprocal operation control section can execute operational control, while a component placement operation is performed in either one of the first and second mounting units, so as not to perform a component placement or component holding operation in the other of the first and second mounting units by accelerating or decelerating an operating speed, in regions before and after a component placement operation or before and after a component holding operation in the other of the first and second mounting units, to be within a range in which no influence is exerted on the component placement operation during the component placement operation in the one of the first and second mounting units.

According to an eighth aspect of the present invention, there is provided a component mounting apparatus as defined in the fourth aspect, wherein the reciprocal operation control section can execute operational control, while a component placement operation is performed in either one of the first and second mounting units, so as not to perform a component placement or component holding operation by stopping operation in the other of the first and second mounting units.

According to a ninth aspect of the present invention, there is provided a component mounting apparatus as defined in the fifth or seventh aspect, wherein the reciprocal operation control section can determine, when an operation is performed in either one of the first and second mounting units, whether or not an operation in the other mounting unit is decelerating or stopping and, if the operation is not decelerating or stopping, the control section can execute operational control of the operation in the one mounting unit and the operation in the other mounting unit by performing a decelerating operation in the other mounting unit.

According to a tenth aspect of the present invention, there is provided a component mounting apparatus as defined in the sixth or eighth aspect, wherein the reciprocal operation control section can determine, when an operation is performed in either one of the first and second mounting units, whether or not an operation in the other mounting unit is decelerating or stopping and, if the operation is not decelerating or stopping, the control section can execute operational control of the operation in the one mounting unit and the operation in the other mounting unit by performing a stopping operation in the other mounting unit.

According to an eleventh aspect of the present invention, there is provided a component mounting apparatus as defined in any one of the first through tenth aspects, wherein the component mounting operation of the second component onto the second mounting base object in the second mounting region is performed concurrently with the mounting operation of the first component onto the first mounting base object in the first mounting region, and thereafter a component mounting operation of the second component onto the first mounting base object is performed with the first mounting base object loaded into the second mounting region.

According to a twelfth aspect of the present invention, there is provided a component mounting apparatus as defined in any one of the first through tenth aspects, wherein the component mounting operation of the second component onto the second mounting base object in the second mounting region is performed concurrently with the mounting operation of the first component onto the first mounting base object in the first mounting region, and thereafter a component mounting operation is performed in each mounting region by unloading the second mounting base object from the second mounting region, unloading the first mounting base object through and from the second mounting region, thereafter loading a new second mounting base object into the second mounting region via the first mounting region, and loading a new first mounting base object into the first mounting region.

According to a thirteenth aspect of the present invention, there is provided a component mounting apparatus for mounting components received from a plurality of component supply members, by a plurality of component holding members, onto a mounting base object constituted by connecting in one direction of connection a plurality of component placement regions in which same components are to be placed in same positions, and placing the plurality of components held by the plurality of component holding members in the plurality of component placement regions, wherein the plurality of component holding members are arranged while being aligned at a pitch interval corresponding to an arrangement pitch of the plurality of component supply members with respect to one head section, and the plurality of components are concurrently received from the plurality of component supply members and held by the plurality of component holding members, wherein the mounting base object has a plurality of objective placement regions of an identical shape connected in the direction of connection at a pitch interval corresponding to the arrangement pitch of the plurality of component supply members, and wherein the head section moves relative to the mounting base object to place the plurality of components held by the plurality of component holding members of the head section in the plurality of objective placement regions so that the direction of alignment becomes identical to the direction of connection in which the plurality of objective placement regions of the mounting base object are connected together.

According to a fourteenth aspect of the present invention, there is provided a component mounting apparatus as defined in any one of the first through twelfth aspects, wherein each mounting base object has a plurality of objective placement regions, which are connected together in one direction of connection and in which same components are to be placed in same positions, wherein each mounting unit has each component supplying device provided with a plurality of component supply members, can hold each component received from the plurality of component supply members by the plurality of component holding members, and place the plurality of components held by the plurality of component holding members provided for each head section in the plurality of objective placement regions, wherein the plurality of component holding members are arranged while being aligned at a pitch interval corresponding to an arrangement pitch of the plurality of component supply members with respect to one head section, and can concurrently hold the plurality of components received from the plurality of component supply members by the plurality of component holding members, wherein each mounting base object has a plurality of objective placement regions of an identical shape connected in the direction of connection at a pitch interval corresponding to the arrangement pitch of the plurality of component supply members, and wherein each head section moves relative to each mounting base object to place the plurality of components held by the plurality of component holding members of each head section in the plurality of objective placement regions so that the direction of alignment becomes identical to the direction of connection in which the plurality of objective placement regions of each mounting base object are connected together.

According to a fifteenth aspect of the present invention, there is provided a component mounting apparatus as defined in the thirteenth or fourteenth aspect, further comprising:

a first nozzle replacement section in which each of the first component holding members is a suction nozzle to be detachably attached to a nozzle holder of the first head section, and replacement nozzles that can be replaced by a plurality of suction nozzles attached to the first head section are arranged while being aligned at a pitch interval corresponding to the arrangement pitch of the plurality of component supply members; and a second nozzle replacement section in which each of the second component holding members is a suction nozzle to be detachably attached to a nozzle holder of the second head section, and replacement nozzles that can be replaced by a plurality of suction nozzles attached to the second head section are arranged while being aligned at a pitch interval corresponding to the arrangement pitch of the plurality of component supply members, wherein the plurality of suction nozzles can be concurrently replaced by the plurality of replacement nozzles in a corresponding nozzle replacement section.

According to a sixteenth aspect of the present invention, there is provided a component mounting method comprising: loading a first mounting base object into a first mounting base object holding device of a first mounting region in a first mounting unit in the first mounting region obtained by dividing a component mounting work region for performing component mounting into the first mounting region and a second mounting region across a boundary of a path in which first and second mounting base objects are conveyed; holding the first mounting base object by the first mounting base object holding device; thereafter holding a component by a first component holding member; recognizing the first component held by the first component holding member; placing the first component held by the first component holding member onto the first mounting base object; concurrently loading the second mounting base object into the second mounting base object holding device in the second mounting region, via the first mounting region, into a second mounting unit in the second mounting region; holding the second mounting base object by the second mounting base object holding device; thereafter holding a second component by a second component holding member; recognizing the second component held by the second component holding member; placing the second component held by the second component holding member onto the second mounting base object; and executing operational control of an operation in either one of the first and second mounting units and an operation in the other mounting unit if the operation in the other mounting unit exerts an unfavorable influence on the operation in the one mounting unit when performing the operation in the one mounting unit.

According to a seventeenth aspect of the present invention, there is provided a component mounting method as defined in the sixteenth aspect, wherein, while a component recognizing operation is performed in either one of the first and second mounting units when the operational control of the operation in the one mounting unit and the operation in the other mounting unit is executed, the operational control is executed so as not to perform a component placement or component holding operation in the other of the first and second mounting units.

According to an eighteenth aspect of the present invention, there is provided a component mounting method as defined in the sixteenth or seventeenth aspect, wherein, while a mounting base object recognizing operation is performed in either one of the first and second mounting units when the operational control of the operation in the one mounting unit and the operation in the other mounting unit is executed, the operational control is executed so as not to perform a component placing or component holding operation in the other of the first and second mounting units.

According to a nineteenth aspect of the present invention, there is provided a component mounting method as defined in any one of the sixteenth through eighteenth aspects, wherein, while a placing operation for placing a C4 component, as a component to be mounted, is performed in either one of the first and second mounting units when the operational control of the operation in the one mounting unit and the operation in the other mounting unit is executed, the operational control is executed so as not to perform a component placement or component holding operation in the other of the first and second mounting units.

According to a twentieth aspect of the present invention, there is provided a component mounting method as defined in any one of the sixteenth through eighteenth aspects, wherein, when the operational control of the operation in the one mounting unit and the operation in the other mounting unit is executed, the operational control is executed so as not to perform a component placement or component holding operation in the other of the first and second mounting units while a recognizing operation is performed in the one of the first and second mounting units by accelerating or decelerating an operating speed, in regions before and after the component placement operation or before and after the component holding operation in the other of the first and second mounting units, to be within a range in which no influence is exerted on the recognizing operation during the component recognizing operation in the one of the first and second mounting units.

According to a twenty-first aspect of the present invention, there is provided a component mounting method as defined in any one of the sixteenth through eighteenth aspects, wherein, when the operational control of the operation in the one mounting unit and the operation in the other mounting unit is executed, the operational control is executed so as not to perform the component placement or component holding operation by stopping the operation in the other of the first and second mounting units while the recognizing operation is performed in the one of the first and second mounting units.

According to a twenty-second aspect of the present invention, there is provided a component mounting method as defined in the nineteenth aspect, wherein, when the operational control of the operation in the one mounting unit and the operation in the other mounting unit is executed, the operational control is executed so as not to perform the component placement or component holding operation in the other of the first and second mounting units while the component placement operation is performed in the one of the first and second mounting units by accelerating or decelerating an operating speed, in regions before and after the component placement operation or before and after the component holding operation in the other of the first and second mounting units, to be within a range in which no influence is exerted on the component placement operation during the component placement operation in the one of the first and second placing units.

According to a twenty-third aspect of the present invention, there is provided a component mounting method as defined in the nineteenth aspect, wherein, when the operational control of the operation in the one mounting unit and the operation in the other mounting unit is executed, the operational control is executed so as not to perform the component placement or component holding operation by stopping the operation in the other of the first and second mounting units while the component placement operation is performed in the one of the first and second mounting units.

According to a twenty-fourth aspect of the present invention, there is provided a component mounting method as defined in the twentieth or twenty-second aspect, further comprising, when the operational control of the operation in the one mounting unit and the operation in the other mounting unit is executed, determining, when the operation is performed in either one of the first and second mounting units, whether or not the operation in the other mounting unit is decelerating or stopping and, if the operation is not decelerating or stopping, executing operational control of the operation in the one mounting unit and the operation in the other mounting unit by performing a decelerating operation in the other mounting unit.

According to a twenty-fifth aspect of the present invention, there is provided a component mounting method as defined in the twenty-first or twenty-third aspect, further comprising, when the operational control of the operation in the one mounting unit and the operation in the other mounting unit is executed, determining, when the operation is performed in either one of the first and second mounting units, whether or not the operation in the other mounting unit is decelerating or stopping and, if the operation is not decelerating or stopping, executing operational control of the operation in the one mounting unit and the operation in the other mounting unit by performing a stopping operation in the other mounting unit.

According to a twenty-sixth aspect of the present invention, there is provided a component mounting method as defined in any one of the sixteenth through twenty-first aspects, further comprising, after the component mounting operation of the second component onto the second mounting base object in the second mounting region is performed concurrently with the mounting operation of the first component onto the first mounting base object in the first mounting region, loading the first mounting base object into the second mounting region, and then performing a component mounting operation of a second component onto the first mounting base object.

According to a twenty-seventh aspect of the present invention, there is provided a component mounting method as defined in any one of the sixteenth through twenty-first aspects, further comprising, after the component mounting operation of the second component onto the second mounting base object in the second mounting region is performed concurrently with the mounting operation of the first component onto the first mounting base object in the first mounting region, unloading the second mounting base object from the second mounting region and unloading the first mounting base object from the first mounting region, thereafter loading a new second mounting base object into the second mounting region via the first mounting region and loading a new first mounting base object into the first mounting region, and then performing a component mounting operation in each mounting region.

According to a twenty-eighth aspect of the present invention, there is provided a component mounting method for mounting components, received from a plurality of component supply members, by a plurality of component holding members onto a mounting base object constituted by connecting in one direction of connection a plurality of component placement regions in which same components are to be placed in same positions, and placing the plurality of components held by the plurality of component holding members in the plurality of component placement regions, the method comprising:

with the plurality of component holding members arranged while aligning the component holding members at a pitch interval corresponding to an arrangement pitch of the plurality of component supply members with respect to one head section, concurrently holding the plurality of components, received from the plurality of component supply members, by the plurality of component holding members;

providing the mounting base object with a plurality of objective placement regions of an identical shape connected in the direction of connection at a pitch interval corresponding to the arrangement pitch of the plurality of component supply members; and moving the head section relative to the mounting base object to place the plurality of components held by the plurality of component holding members of the head section so that the direction of alignment becomes identical to the direction of connection in which the plurality of objective placement regions of the mounting base object are connected together.

According to a twenty-ninth aspect of the present invention, there is provided a component mounting method as defined in any one of the sixteenth through twenty-seventh aspects, wherein, with each mounting base object having a plurality of objective placement regions, which are connected together in one direction of connection and in which same components are to be placed in same positions, and with each mounting unit having each component supplying device provided with a plurality of component supply members, holding each component, received from the plurality of component supply members, by the plurality of component holding members and placing the plurality of components held by the plurality of component holding members provided for each head section in the plurality of objective placement regions;

wherein, with the plurality of component holding members arranged while being aligned at a pitch interval corresponding to an arrangement pitch of the plurality of component supply members with respect to one head section, concurrently holding the plurality of components, received from the plurality of component supply members, by the plurality of component holding members; and wherein, with each mounting base object having a plurality of objective placement regions of an identical shape connected in the direction of connection at a pitch interval corresponding to the arrangement pitch of the plurality of component supply members, moving each head section relative to each mounting base object and placing the plurality of components held by the plurality of component holding members of each head section in the plurality of objective placement regions so that the direction of alignment becomes identical to the direction of connection in which the plurality of objective placement regions of each mounting base object are connected together.

According to a thirtieth aspect of the present invention, there is provided a component mounting method as defined in the twenty-eighth or twenty-ninth aspect, further comprising concurrently replacing a plurality of suction nozzles, as the plurality of component holding members in the first head section, with a plurality of replacement nozzles in a first nozzle replacement section, in which each of the first component holding members is a suction nozzle to be detachably attached to a nozzle holder of the first head section, with the replacement nozzles that can be used to replace the plurality of suction nozzles attached to the first head section being arranged while being aligned at a pitch interval corresponding to the arrangement pitch of the plurality of component supply members; and concurrently replacing the plurality of suction nozzles, as the plurality of component holding members in the second head section, with a plurality of replacement nozzles in a second nozzle replacement section in which each of the second component holding members is a suction nozzle to be detachably attached to the nozzle holder of the second head section, with the replacement nozzles that can be used to replace the plurality of suction nozzles attached to the second head section being arranged while being aligned at a pitch interval corresponding to the arrangement pitch of the plurality of component supply members.

BRIEF DESCRIPTION OF DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
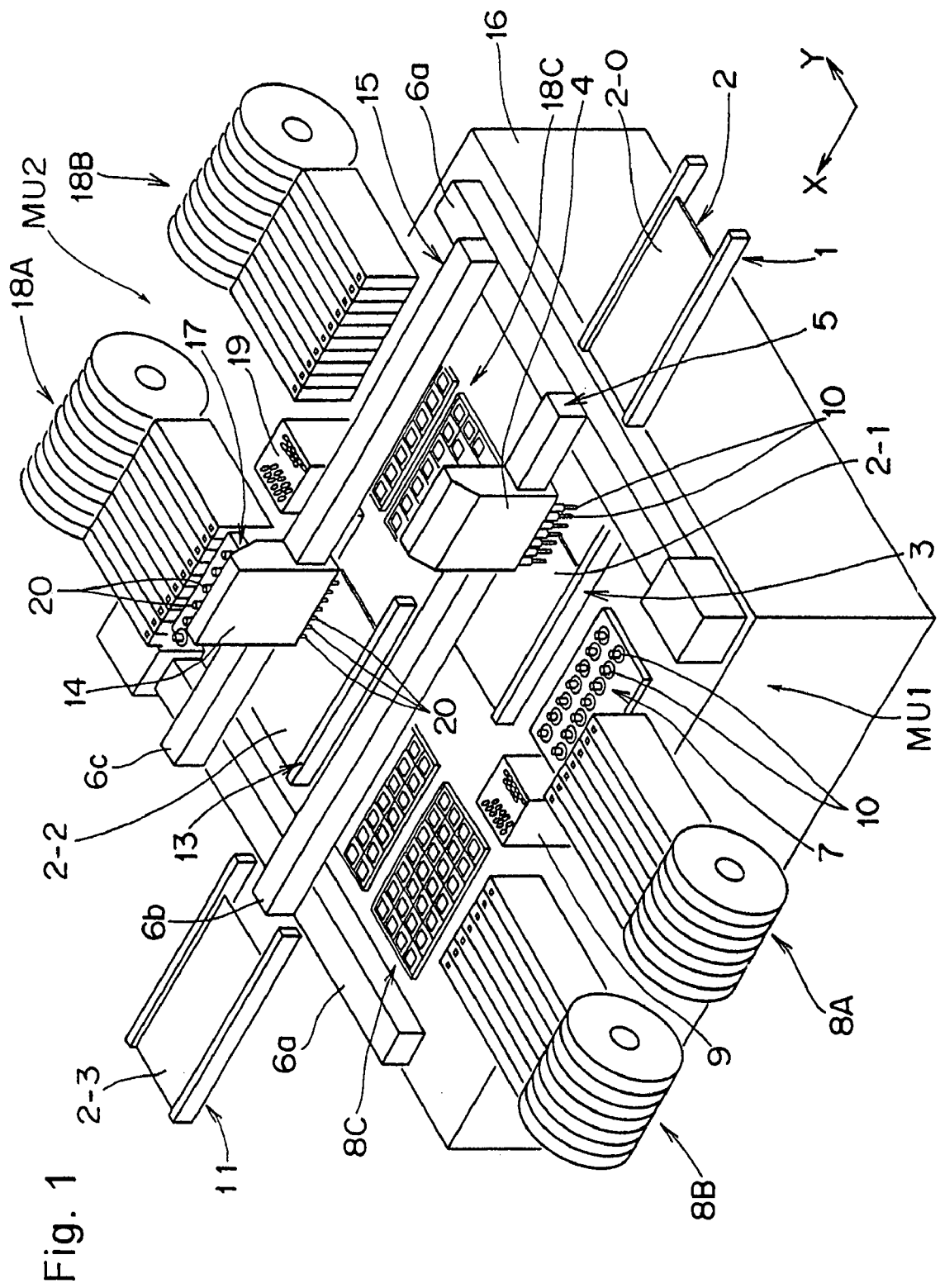
FIG. 1 is an overall schematic perspective view of an electronic component mounting apparatus according to one embodiment of the present invention.

Before description of the present invention proceeds, it is to be noted that like parts are designated by like reference numerals throughout the accompanying drawings.

Embodiments of the present invention will be described in detail below on the basis of the drawings.

Figure 2:
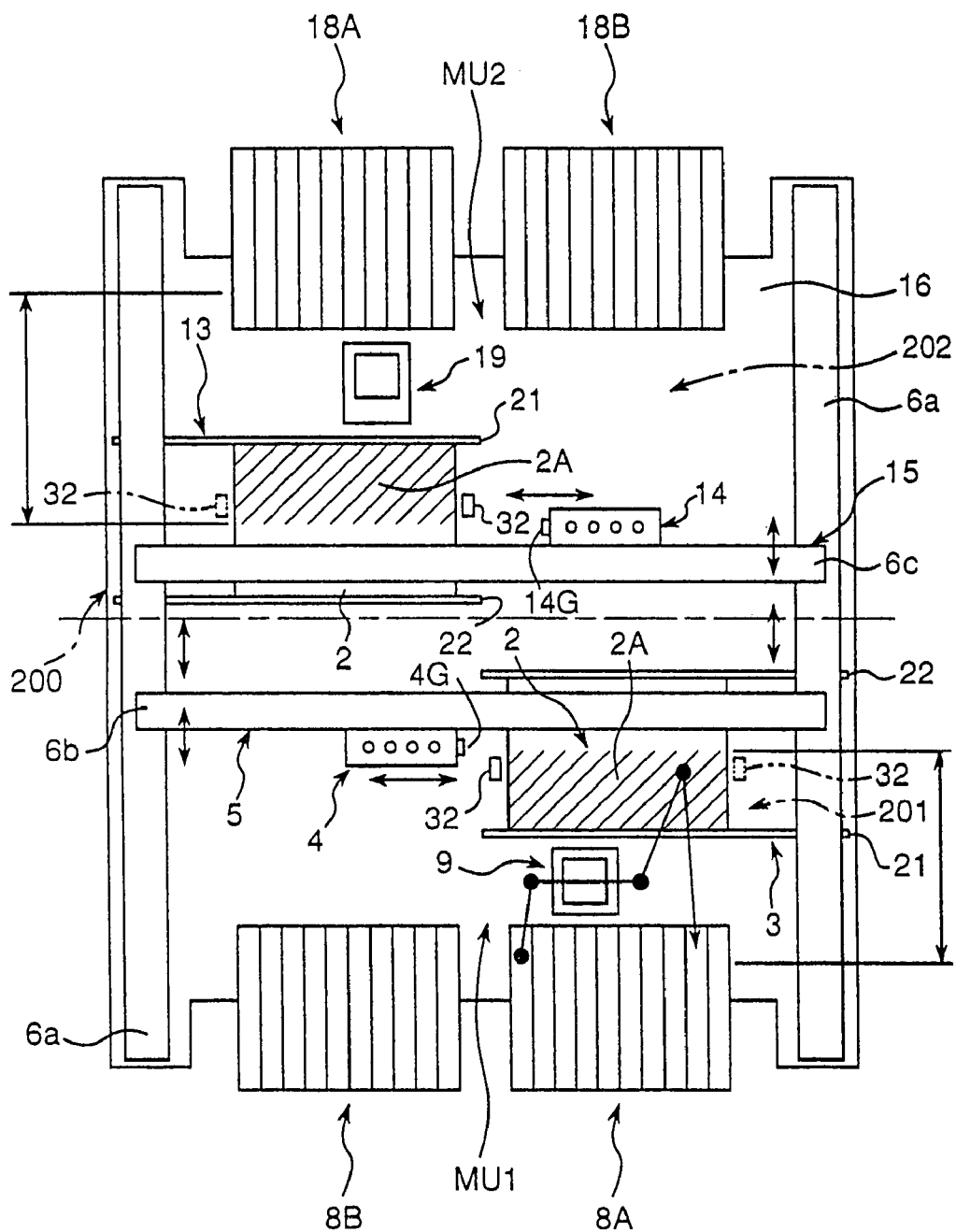
FIG. 2 is a plan view of the electronic component mounting apparatus of the one embodiment of the present invention.
Figure 3:
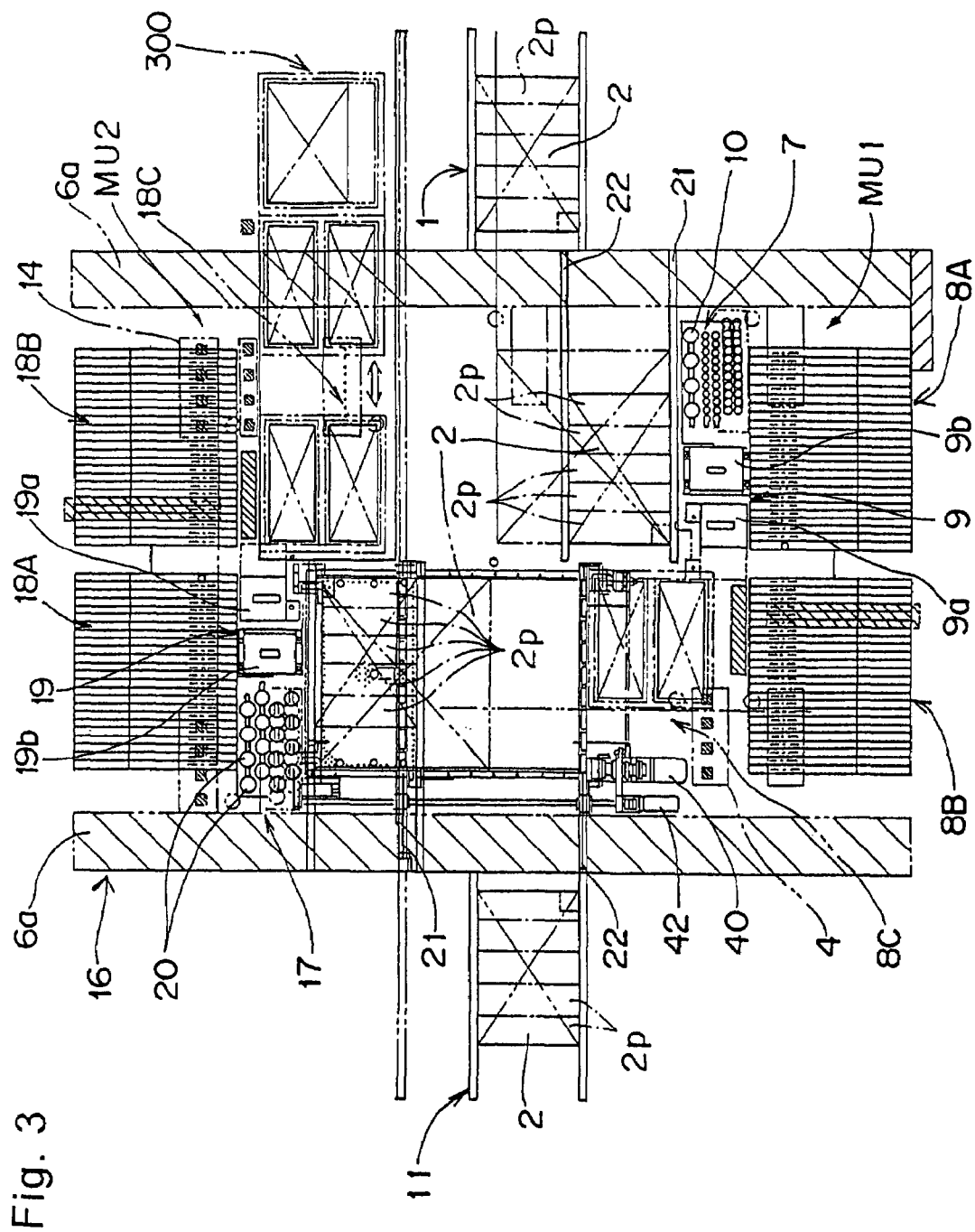
FIG. 3 is a detailed plan view of an entire body of the component mounting apparatus of FIG. 1.

As shown in FIGS. 1 through 3, according to component mounting apparatus and method of one embodiment of the present invention, a component mounting work region 200, in which component mounting is performed, is divided into a first mounting region 201 and a second mounting region 202 across a boundary of, for example, a path through which a mounting base object 2 (herein assumed to be a board in this case as one example) such as a component or a board is conveyed. A first mounting unit MU1 is arranged in the first mounting region 201, and a second mounting unit MU2 is arranged in the second mounting region 202.

That is, FIGS. 1 and 2 show an overall schematic perspective view and a plan view of the electronic component mounting apparatus of the above-mentioned embodiment of the present invention. FIG. 1 is a detailed plan view of an entire body of the component mounting apparatus of FIG. 1. In FIGS. 1 through 3, reference numeral 1 denotes a loader that is arranged on a board loading side of the component mounting work region 200 and loads an electronic circuit board 2 into a central portion of the component mounting work region 200, in which the first mounting region 201 and the second mounting region 202 adjoin each other. Reference numeral 11 denotes an unloader that is arranged on a board unloading side of the component mounting work region 200 and unloads the electronic circuit board 2 from the central portion of the component mounting work region 200 in which the first mounting region 201 and the second mounting region 202 adjoin each other. In the electronic component mounting apparatus of the above embodiment, various constituent elements are arranged point-symmetrically with respect to a central point of the component mounting work region 200 as follows.

The first mounting unit MU1 is provided with: first component supply members 8A and 8B constructed of first component supplying devices of, for example, first component supply cassettes such as parts feeders for supplying first components; a first working head 4 that functions as a first head section having first component holding members (for example, ten or four first suction nozzles 10, ... , 10) for holding the first components supplied from the first component supply members 8A and 8B; a first recognition camera 9 that functions as a first component recognizing device for recognizing the first components held by the first suction nozzles 10, ... , 10; a first board conveying and holding device 3 that functions as a first board conveying and holding device for holding a first board 2-1, which has been loaded into the first mounting region 201 and on which the first components recognized by the first recognition camera 9 and held by the first suction nozzles 10, ... , 10 are placed; and a first X-Y robot 5 that functions as a first head section moving device for moving the first working head 4 between the first component supply members 8A and 8B, the first recognition camera 9, and the first board conveying and holding device 3.

In detail, the first board conveying and holding device 3 is provided with a pair of support rail sections 21 and 22 for conveying and holding the first board 2 loaded from the loader 1 in the first mounting region 201 (these support rail sections are denoted by reference numerals 21 and 22 when mentioned without regard to positions thereof, and the support rail sections located in specified positions are denoted by reference numerals 21-1, 21-2, 22-1, and 22-2). As described above, the first working head 4 is provided with a plurality of, for example, ten first suction nozzles 10 mounted in a replaceable style for sucking and holding electronic components in the first mounting region 201. The first X-Y robot 5 positions the first working head 4 inside the first mounting region 201 into a specified position in X- and Y-directions, which are two orthogonal directions in the first mounting region 201. In the figures, reference numeral 7 denotes a first nozzle station, which is arranged in the vicinity of the first component supply member 8A in the first mounting region 201, stores a plurality of types of first replacement use nozzles 10, ... , 10 appropriate for a plurality of types of electronic components, and can replace the nozzles 10 attached to the first working head 4 as occasion demands. The first component supply members 8A and 8B are arranged on this side of an operator, i.e., at a front-side end portion of the first mounting region 201 with respect to the operator, and store tape components that are stored and held in a tape form and are to be mounted onto the first board 2. In the figures, reference numeral 8C denotes a first component supply member, which is arranged in the vicinity of the first component supply member 8B in the first mounting region 201 and stores tray components that are stored and held in a tray form and are to be mounted onto the first board 2. The first recognition camera 9 is arranged on a side near a center of the component mounting work region in the vicinity of the first component supply member 8A in the first mounting region 201 and picks up images of suction postures of electronic components sucked and held by the first suction nozzles 10, ... , 10 of the first working head 4. In FIG. 3, reference numeral 9a denotes a two-dimensional camera of the first recognition camera 9, and 9b denotes a three-dimensional camera of the first recognition camera 9.

The second mounting unit MU2 is provided with: second component supply members 18A and 18B constructed of second component supplying devices of, for example, second component supply cassettes such as parts feeders for supplying second components; a second working head 14 that functions as a second head section having second component holding members (for example, ten or four second suction nozzles 20, . . . , 20) for holding the second components supplied from the second component supply members 18A and 18B; a second recognition camera 19 that functions as a second component recognizing device for recognizing the second components held by the second suction nozzles 20, . . . , 20; a second board conveying and holding device 13 that functions as a second board conveying and holding device for holding a second board 2-2, which has been loaded from the first mounting region 201 into the second mounting region 202 and on which the second components recognized by the second recognition camera 19 and held by the second suction nozzles 20, . . . , 20 are placed; and a second X-Y robot 15 that functions as a second head section moving device for moving the second working head 14 between the second component supply members 18A and 18B, the second recognition camera 19, and the second board conveying and holding device 13.

In detail, the second board conveying and holding device 13 is provided with a pair of support rail sections 21 and 22 for conveying and holding the second board 2 loaded from the first board conveying and holding device 3, of the first mounting region 201, into the second mounting region 202. The second working head 14 is provided with a plurality of, for example, ten second suction nozzles 20, . . . , 20 mounted in a replaceable style for sucking and holding electronic components in the second mounting region 202. The second X-Y robot 15 positions the second working head 14 inside the second mounting region 202 into a specified position in the X- and Y-directions, which are two orthogonal directions in the second mounting region 202. In the figures, reference numeral 17 denotes a second nozzle station, which is arranged in the vicinity of the second component supply member 18A (described later) in the second mounting region 202, stores a plurality of types of the second replacement use nozzles 20, . . . , 20 appropriate for a plurality of types of electronic components, and can replace the second suction nozzles 20, . . . , 20 attached to the second working head 14 as occasion demands. The second component supply members 18A and 18B are arranged on an opposite side of the operator, i.e., at a rear-side end portion of the second mounting region 202 with respect to the operator, and store tape components that are stored and held in a tape form and are to be mounted on the second board 2. In the figures, reference numeral 18C denotes a second component supply member, which is arranged in the vicinity of the second component supply member 18B of the second mounting region 202 and stores tray components that are stored and held in a tray form and are to be mounted on the second board 2. The second recognition camera 19 is arranged on a side near the center of the component mounting work region in the vicinity of the second component supply member 18A in the second mounting region 202, and picks up images of suction postures of electronic components sucked and held by the second suction nozzles 20, . . . , 20 of the second working head 14. In FIG. 3, reference numeral 19a denotes a two-dimensional camera of the second recognition camera 19, and 19b denotes a three-dimensional camera of the second recognition camera 19.

The first and second X-Y robots 5 and 15 are each constructed as follows. Two Y-axis drive sections 6a and 6a of an X-Y robot device are arranged while being fixed to front and rear end edges in a board conveyance direction of the component mounting work region 200 on a mounting apparatus base 16, and two X-axis drive sections 6b and 6c are arranged independently movably in the Y-axis direction across these two Y-axis drive sections 6a and 6a while being able to evade collision. Further, the first working head 4 that moves inside the first mounting region 201 is arranged movably in the X-axis direction on the X-axis drive section 6b, and the second working head 14 that moves inside the second mounting region 202 is movably arranged in the X-axis direction on the X-axis drive section 6c. Therefore, the first X-Y robot 5 is constructed of the two Y-axis drive sections 6a and 6a fixed to the mounting apparatus base 16, the X-axis drive section 6b that can be moved in the Y-axis direction on the Y-axis drive sections 6a and 6a, and the first working head 4 that can be moved in the X-axis direction on the X-axis drive section 6b. The second X-Y robot 15 is constructed of the two Y-axis drive sections 6a and 6a fixed to the mounting apparatus base 16, the X-axis drive section 6c that can be moved in the Y-axis direction on the Y-axis drive sections 6a and 6a, and the second working head 14 that can be moved in the X-axis direction on the X-axis drive section 6c. Thus, the working heads 4 and 14 can be moved in the X- and Y-directions fundamentally independently.

Figure 4:
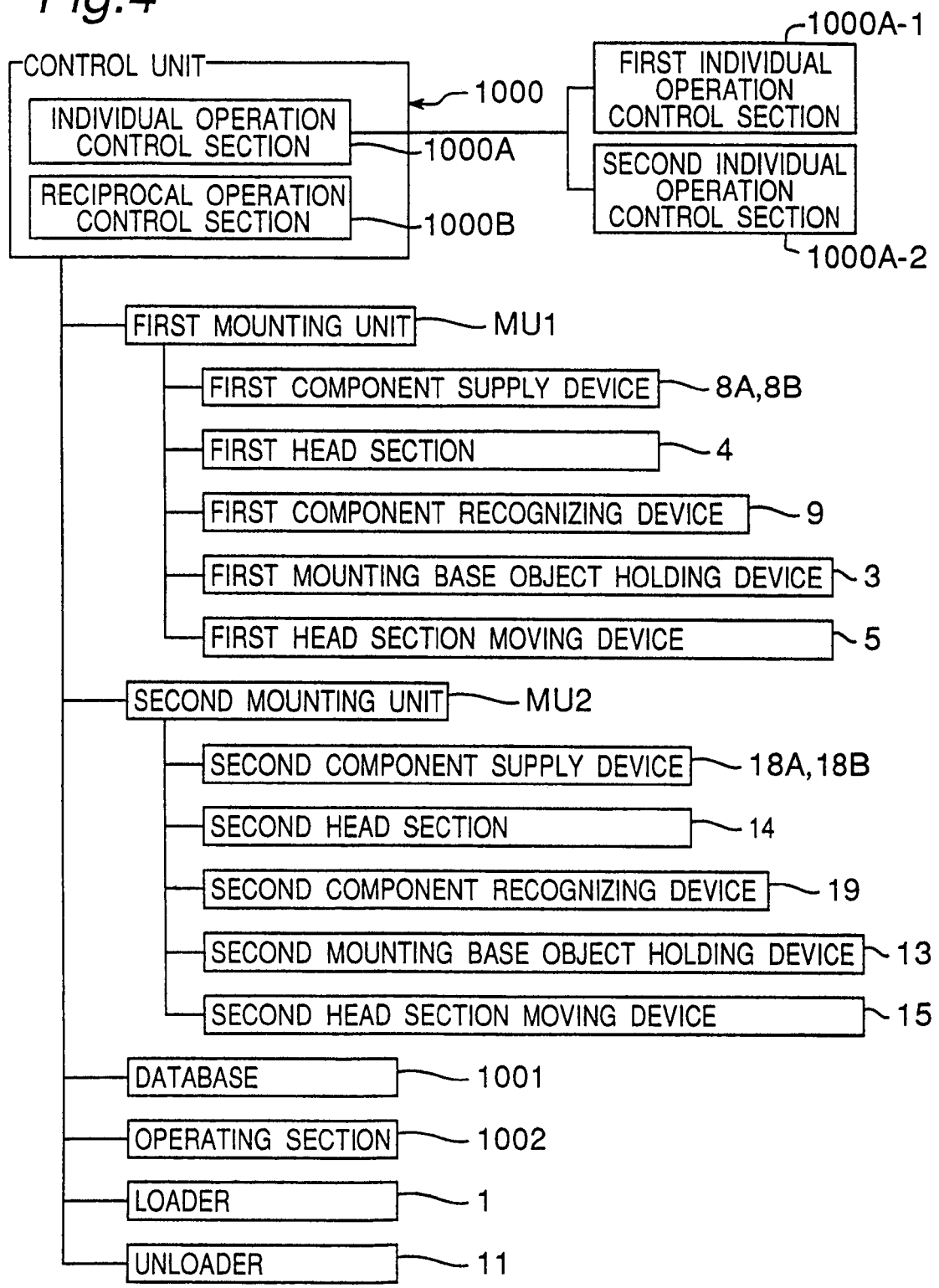
FIG. 4 is a view of a control block for executing operational control of members or devices of the component mounting apparatus.

As shown in FIG. 4, the component mounting apparatus is provided with a control unit 1000 for executing operational control of the aforementioned members or devices. This control unit 1000 is provided with an individual operation control section 1000A for executing operational control of the mounting units MU1 and MU2, and a reciprocal operation control section 1000B for controlling reciprocal operation of both the mounting units MU1 and MU2. In FIG. 4, reference numeral 1001 denotes a database and 1002 denotes an operating section. The data base 1001 stores NC data that indicates which components are to be placed at which positions in which placement order, an arrangement program that indicates which components are arranged in which component supply members or arrangement information in which the components have been arranged, a component library of component information concerning shapes and heights of components, board information concerning shapes of boards, and other information of shapes of the component suction nozzles, board conveyance positions of the support rail sections, and so on. The operating section 1002 executes a desired operation based on the aforementioned information and information obtained during mounting, e.g., an operation for correction of component postures and correction of placement positions based on component recognition results.

In the first mounting unit MU1, the individual operation control section 1000A controls so as to have the first board 2-1 loaded into the first board conveying and holding device 3 in the first mounting region 201, have the first board 2-1 held by the first board conveying and holding device 3, thereafter have first components supplied from the first component supply members 8A, 8B, or 8C held by virtue of the first suction nozzles 10, . . . , 10 by moving the first working head 4 by driving of the X-Y robot 5, have the first components held by the first suction nozzles 10, . . . , 10 recognized by virtue of the first recognition camera 9, and thereafter have the first components held by the first suction nozzles 10, . . . , 10 placed on the first board 2-1 held by the first board conveying and holding device 3. In the second mounting unit MU2, the individual operation control section 1000A controls so as to have the second board 2-2 loaded into the second board conveying and holding device 13 in the second mounting region 202 via the first mounting region 201, have the second board 2-2 held by the second board conveying and holding device 13, thereafter have the second components supplied from the second component supply members 18A, 18B, or 18C held by virtue of the second suction nozzles 20, . . . , 20 by moving the second working head 14 by driving of the second X-Y robot 15, have the second components held by the second suction nozzles 20, . . . , 20 recognized by virtue of the second recognition camera 19, and have the second components held by the second suction nozzles 20, . . . , 20 placed on the second board 2-2 held by the second board conveying and holding device 13.

When executing an operation in either one of the first and second mounting units MU1 and MU2, if vibrations and the like of operation of the other mounting unit exerts unfavorable influence on the operation of one mounting unit, then the reciprocal operation control section 1000B executes operational control of the operation in the one mounting unit and the operation in the other mounting unit. As an example, while per forming a component recognizing operation in either one of the first and second mounting units MU1 and MU2, the reciprocal operation control section 1000B executes the operational control so as not to execute a component placing or component holding operation in the other of the first and second mounting units MU1 and MU2.

Moreover, as shown in FIG. 2, when the first mounting unit MU1 is further provided with a first board recognizing device 4G for recognizing the first board 2-1 held by the first board conveying and holding device 3 and the second mounting unit is provided with a second board recognizing device 14G for recognizing the second board 2-2 held by the second board conveying and holding device 13, while a board recognizing operation is performed in either one of the first and second mounting units MU1 and MU2, the reciprocal operation control section 1000B executes operational control so as not to perform a component placing or component holding operation in the other of the first and second mounting units MU1 and MU2.

Concretely, when, during a component or board recognizing operation in either one of the first and second mounting units MU1 and MU2, an operating speed is accelerated or decelerated in a region before and after a component placing operation or before and after a component holding operation in the other of the first and second mounting units MU1 and MU2, the reciprocal operation control section 1000B effects acceleration or deceleration within a range in which no influence is exerted on the component or board recognizing operation, or in other words, within a range in which variations and the like exert no unfavorable influence on the component or board recognizing operation. By so doing, while the component or board recognizing operation is executed in either one of the first and second mounting units MU1 and MU2, operational control can be performed so as not to perform the component placing or component holding operation in the other of the first and second mounting units MU1 and MU2. Instead of effecting acceleration or deceleration within a range in which no influence is exerted on the component or board recognizing operation, the reciprocal operation control section executes operational control so as not to perform a component placing or component holding operation by stopping the operation in the other of the first and second mounting units MU1 and MU2 while the component or board recognizing operation is executed in the one of the first and second mounting units MU1 and MU2.

Under control of the control unit 1000, it is enabled to perform a component mounting operation of the second components onto the second board 2-2 in the second mounting region 202 concurrently with a component mounting operation of the first components onto the first board 2-1 in the first mounting region 201, and thereafter perform a component mounting operation of the second components onto the first board 2-1 by loading the first board 2-1 into the second mounting region.

Moreover, under control of the control unit 1000, it is also possible to perform component mounting operations in the mounting regions 201 and 202 by performing a component mounting operation of the second components onto the second board 2-2 in the second mounting region 202 concurrently with a component mounting operation of the first components onto the first board 2-1 in the first mounting region 201, thereafter unloading the second board 2-2 from the second mounting region, unloading the first board 2-1 via the second mounting region 202, thereafter loading a new second board 2-2 into the second mounting region 202 via the first mounting region 201, and loading a new first board 2-1 into the first mounting region 201.

Moreover, under control of the control unit 1000, when each board is constructed by connecting a plurality of objective placement regions $2p$, . . . , $2p$ in which same components are to be placed in same positions in a single connection direction, it is also acceptable to construct one board 2 by connecting a plurality of, for example, five boards $2p$, . . . , $2p$ of portable electronic equipment such as a cellular telephone, hold components from a plurality of component supply members 8A, 8B, 8C, 18A, 18B, and 18C by virtue of a plurality of suction nozzles 10, . . . , 10 or 20, . . . , 20, and place the plurality of components held by the plurality of suction nozzles 10, . . . , 10 or 20, . . . , 20 in respective ones of the objective placement regions $2p$, . . . , $2p$ of the first board and the second board.

In this case, the plurality of suction nozzles 10, . . . , 10 and 20, . . . , 20 are arranged while being aligned at a pitch interval corresponding to a pitch of arrangement of the plural component supply members 8A, 8B, 8C, 18A, 18B, and 18C with respect to respective ones of the working heads 4 and 14 (in this case, the "pitch interval corresponding to the arrangement pitch" means a pitch interval equal to the arrangement pitch as well as a pitch interval of an integral multiple of the arrangement pitch, or a pitch interval of an arbitrary multiple being, for example, two times, three times, or four times as large as the arrangement pitch. That is, for example, a 21.5-mm pitch interval or a 43-mm pitch interval two times as large as the pitch interval when the arrangement pitch is 21.5 mm), and the plurality of components from the plurality of component supply members 8A, 8B, 18A, and 18B are concurrently held by the plurality of suction nozzles 10, . . . , 10 and 20, . . . , 20. As described above, if the plurality of nozzles includes those which have an arrangement pitch of a narrow width dimension (21.5 mm, for example) of the component supply member and those which have an arrangement pitch of a wide width dimension (43 mm, for example) two times as wide as the narrow width dimension when aligned at a pitch interval corresponding to the pitch of arrangement of the plurality of component supply members with respect to one working head, then the following arrangement is adopted. That is, when the plurality of nozzles (for example, ten nozzles) are arranged while being aligned at a pitch interval (for example, 21.5-mm intervals) corresponding to the arrangement pitch of the plurality of component supply members of the narrow width, and component holding is performed by the plurality of component supply members of the wide width with the plurality of nozzles (for example, ten nozzles), it is proper to use alternate nozzles (for example, an odd-number or even-number of nozzles) of the plurality of nozzles.

Moreover, with regard to the boards 2-1 and 2-2, it is enabled to connect the plurality of objective placement regions 2p, . . . , 2p of the same shape in a direction of connection at a pitch interval (for example, a 21.5-mm pitch interval when the arrangement pitch is 21.5 mm) corresponding to the arrangement pitch of the plurality of suction nozzles 10, . . . , 10 and 20, . . . , 20, and place the plurality of components held by the plurality of suction nozzles 10, . . . , 10 and 20, . . . , 20 of the working heads 4 and 14 in the plurality of objective placement regions 2p, . . . , 2p by moving the working heads 4 and 14 onto the boards 2 so that the direction of the alignment becomes identical to the direction of the connection in which the plurality of objective placement regions 2p, . . . , 2p of the boards 2 are connected together.

Moreover, the mounting units MU1 and MU2 are provided with the component supply members 8A, 8B, 8C, 18A, 18B, and 18C, and components are held by the suction nozzles 10, . . . , 10 and 20, . . . , 20 after received from the component supply members 8A, 8B, 8C, 18A, 18B, and 18C. The components held by the suction nozzles 10, . . . , 10 and 20, . . . , 20 provided for the working heads 4 and 14 are placed in the plurality of objective placement regions 2p, . . . , 2p. Next, the plurality of suction nozzles 10, . . . , 10 and 20, . . . , 20 are arranged while being aligned at a pitch interval corresponding to a pitch of arrangement of the plurality of component supply members 8A, 8B, 8C, 18A, 18B, and 18C with respect to the respective ones of the working heads 4 and 14, and the plurality of components are concurrently received from the plurality of component supply members 8A, 8B, 8C, 18A, 18B, and 18C, and held by the plurality of suction nozzles 10, . . . , 10 and 20, . . . , 20.

It is also enabled to connect the plurality of objective placement regions 2p, . . . , 2p of the same shape in the direction of the connection at a pitch interval corresponding to the arrangement pitch of the plurality of suction nozzles 10, . . . , 10 and 20, . . . , 20 in the boards, and place the plurality of components held by the plurality of suction nozzles 10, . . . , 10 and 20, . . . , 20 of the working heads 4 and 14 in the plurality of objective placement regions 2p, . . . , 2p by moving the head sections relative to the boards so that the direction of the alignment becomes identical to the direction of the connection in which the plurality of objective placement regions 2p, . . . , 2p of a mounting base object are connected together.

The first suction nozzles 10, . . . , 10 are each detachably attached to the nozzle holder of the first working head 4. In the first nozzle station 7, the first replacement use nozzles 10, . . . , 10 that can be used to replace the plurality of suction nozzles 10, . . . , 10 attached to the working head 4 are aligned at a pitch interval corresponding to the pitch of arrangement of the plurality of first suction nozzles 10, . . . , 10 (in this case, the "pitch interval corresponding to the arrangement pitch of the nozzles" means a pitch interval equal to the arrangement pitch as well as a pitch interval being half the arrangement pitch. That is, for example, a 43-mm pitch interval or a 21.5-mm pitch interval half the pitch interval when the arrangement pitch is 43 mm) and function as a first nozzle replacement section. The second suction nozzles 20, . . . , 20 are each detachably mounted on the nozzle holder of the second working head 14. The second nozzle station 17 functions as a second nozzle replacement section in which second replacement use nozzles 20, . . . , 20 that can be used to replace the plurality of second suction nozzles 20, . . . , 20 attached to the second working head 14 are arranged while being aligned at a pitch interval corresponding to the arrangement pitch of the plurality of second suction nozzles 20, . . . , 20. Therefore, the plurality of suction nozzles 10, . . . , 10 or 20, . . . , 20 can also be concurrently replaced by the plurality of replacement nozzles 10, . . . , 10 or 20, . . . , 20 in the nozzle station.

Moreover, the working heads 4 and 14 of the component mounting apparatus are provided with a component suction nozzle elevation device 41.

Figure 5:
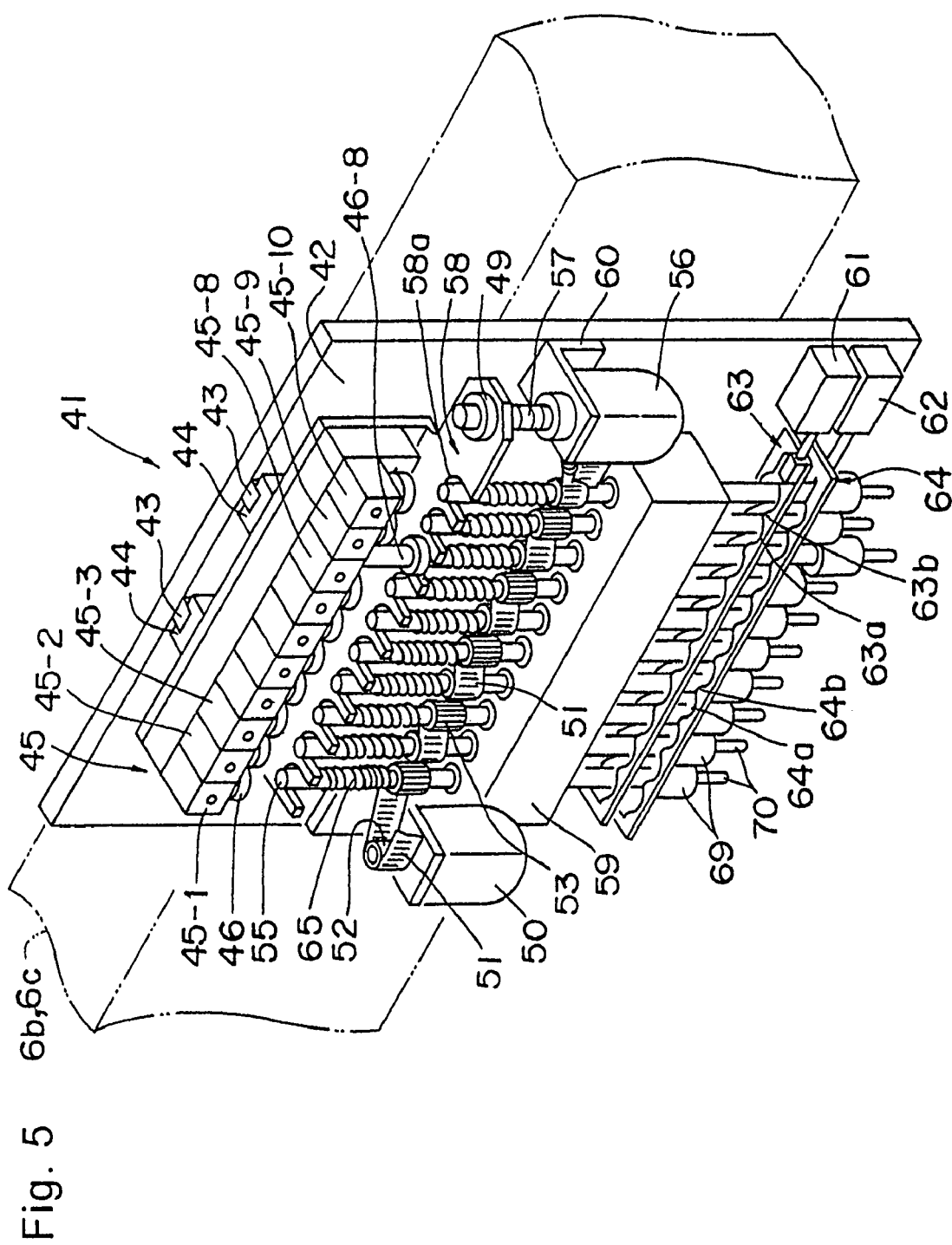
FIG. 5 is a perspective view of a component suction nozzle elevation device of the component mounting apparatus of FIG. 1.
Figure 6:
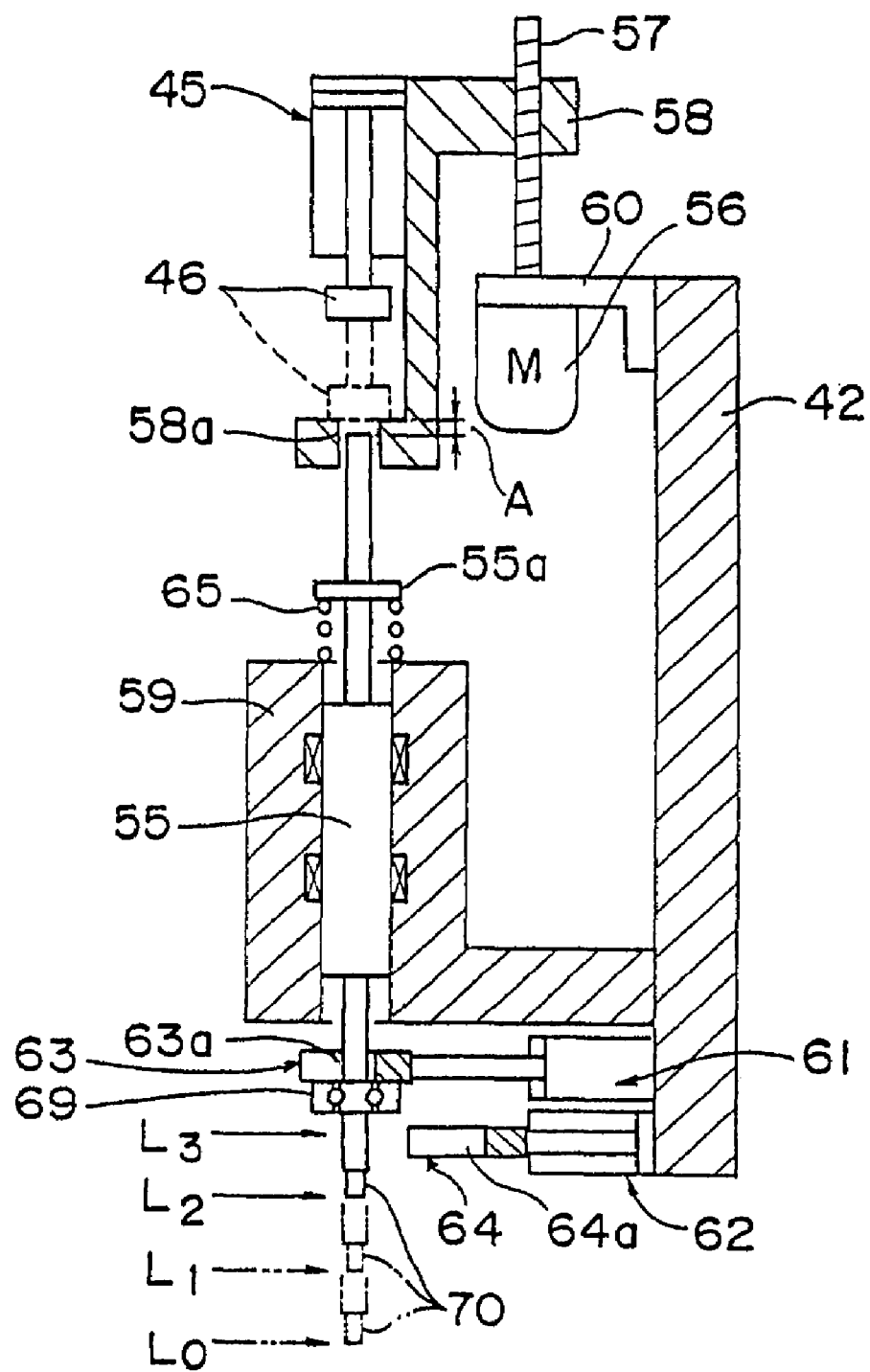
FIG. 6 is a partially sectional explanatory view of the component suction nozzle elevation device of the component mounting apparatus of FIG. 1.

FIG. 5 and FIG. 6 are perspective views of the component suction nozzle elevation device arranged in each of the working heads 4 and 14. Each component suction nozzle elevation device is constructed roughly of a plurality of, for example, ten nozzle elevation shafts 55, nozzle selection cylinders (for example, an air cylinder or an electromagnetic solenoid or the like) 45 that serve as one example of nozzle selection actuators equal in number to the nozzle elevation shafts 55, one elevation drive motor 56 that serves as one example of an elevation use rotary drive unit, and at least one top dead center changing actuator that serves as one example of a top dead center changing unit; that is, top dead center changeover use first and second top dead center changing cylinders (air cylinders, for example) 61 and 62 that serve as one example of two top dead center changing actuators in this embodiment.

The plurality of nozzle elevation shafts 55 support suction nozzles 70 (corresponding to the nozzles denoted by the reference numerals 10 or 20 in the foregoing FIG. 1 through FIG. 4) for sucking and holding components at lower ends of the nozzle elevation shafts 55 via rotary joints 69 and are consistently urged upwardly by springs 65. An elevation operation of the nozzle elevation shafts 55 in the vertical direction is guided by guide members 59 fixed to support plates 42 of the working heads 4 and 14. It is to be noted that an upper end position of each nozzle elevation shaft 55 is regulated so as not to protrude above a specified upper end position by engaging each nozzle elevation shaft 55 with an engagement projection provided for a corresponding guide member 59, or in a similar manner although not concretely shown in the figures.

In correspondence with each of the plural nozzle elevation shafts 55, nozzle selection cylinder 45 (the nozzle selection cylinder is denoted by the reference numeral 45 when mentioned without regard to position, and first through tenth nozzle selection cylinders are denoted by reference numerals 45-1, 45-2, 45-3, 45-4, 45-5, 45-6, 45-7, 45-8, 45-9, and 45-10) is fixed to elevation member 58 that moves up and down with respect to the support plates 42 of the working heads 4 and 14. When one suction nozzle 70 to be moved down is selected, a piston rod 46 of the nozzle selection cylinder 45 corresponding to the nozzle elevation shaft 55 that has the selected suction nozzle 70 is moved down toward an upper end position of the nozzle elevation shaft 55 within a range in which the piston rod 46 is not brought in contact with the nozzle elevation shaft 55. For example, FIG. 5 shows a state in which piston rod 46-8 of nozzle selection cylinder 45-8 corresponding to eighth nozzle 70 is moved down to a lower end position. A disk is fixed to a lower end of each piston rod 46 so that each piston rod 46 has a T-figured side surface, thereby allowing each corresponding nozzle elevation shaft 55 to be easily pressed and then moved down as described later.

The elevation members 58 are supported while being able to move up and down with respect to the support plates 42 of the working heads 4 and 14. That is, each support plate 42 is provided with two parallel linear guide members 43 and 43, and two upper and lower sliders 44 provided on a rear surface of the elevation members 58 move up and down along the linear guide members 43, thereby guiding an elevation operation of the elevation members 58. Further, each elevation member 58 has a through hole or a cut portion 58a (indicated as a cut portion in FIG. 5) through which the upper end portion of each nozzle elevation shaft can penetrate. When one suction nozzle 70 to be moved down is selected from among the plurality of nozzles 70, an upper end portion of the corresponding nozzle elevation shaft 55 is positioned inside the cut portion 58a within a range in which the upper end portion does not protrude above the cut portion 58a, and moved down until a lower end portion of the piston rod 46 of a corresponding nozzle selection cylinder 45 contacts elevation member 58 located at an edge of the cut portion 58a, thus forming a gap A between the lower end of the piston rod 46 and the upper end portion of the nozzle elevation shaft 55 inside the cut portion 58a. When the elevation member 58 is moved down by a rotational operation of the elevation drive motor 56, the lower end of the piston rod 46 and the upper end portion of the nozzle elevation shaft 55 are brought into contact with each other due to the protrusion of the upper end portion of the nozzle elevation shaft 55 from the cut portion 58a, and the nozzle elevation shaft 55 is moved down by the lower end of the piston rod 46.

Elevation drive motors 56 are fixed to the support plates 42 of the working heads 4 and 14 by virtue of brackets 60. A ball thread shaft 57 that serves as one example of a threaded shaft is connected to a rotary shaft of the elevation drive motor 56, and the ball thread shaft 57 is meshed with a nut 49 of the elevation member 58. Therefore, all the nozzle selection cylinders 45 are collectively and concurrently moved up and down by moving up and down the elevation member 58 by forward and reverse rotation of the ball thread shaft 57. Therefore, when all the nozzle selection cylinders 45 are collectively and concurrently moved down, the piston rod 46 selectively moved down from the nozzle selection cylinder 45 is also moved down, by which the piston rod 46 contacts the selected nozzle elevation shaft 55, thus moving down the nozzle elevation shaft 55.

The first top dead center changing cylinder 62 and the second top dead center changing cylinder 61 change a top dead center position of each nozzle elevation shaft 55, and have engagement portions 64 and 63 capable of being engaged with upper end positions of the rotary joints 69 of the nozzle elevation shafts 55 at tips of piston rods of the top dead center changing cylinders 62 and 61. The first top dead center changing cylinder 62 and the second top dead center changing cylinder 61 are fixed to the support plates 42 of the working heads 4 and 14, respectively, so that the first top dead center changing cylinder 62 is positioned below the second top dead center changing cylinder 61.

An engagement portion 64 of the piston rod of the first top dead center changing cylinder 62 is constructed of a plate body such that a non-engagement through hole portion 64a, which has an inside diametrical dimension larger than an outside diametrical dimension of rotary joint 69 located below each nozzle elevation shaft 55 and through which the rotary joint 69 penetrates so as to be put in an unengaged state, and an engagement through hole portion 64b which has an inside diametrical dimension smaller than the outside diametrical dimension of the rotary joint 69 and with which the rotary joint 69 is engaged, are alternately formed. Therefore, non-engagement through hole portions 64a to be put in unengaged states, and engagement through hole portions 64b to be put in engaged states, are selectively positioned with respect to the rotary joints 69 located below all the nozzle elevation shafts 55 by sidewise movement of the piston rod of the first top dead center changing cylinder 62, by which engagement release operations or engagement operations of all the nozzle elevation shafts 55 can be concurrently performed.

The engagement portion 63 of the piston rod of the second top dead center changing cylinder 61 is constructed of a plate body such that a non-engagement through hole portion 63a which has an inside diametrical dimension larger than the outside diametrical dimension of rotary joint 69 located below each nozzle elevation shaft 55 and through which the rotary joint 69 penetrates so as to be put in an unengaged state, and an engagement through hole portion 63b which has an inside diametrical dimension smaller than the outside diametrical dimension of the rotary joint 69 and with which the rotary joint 69 is engaged, are alternately formed. Therefore, non-engagement through hole portions 63a to be put in unengaged states, and engagement through hole portions 63b to be put in engaged states, are selectively positioned with respect to the rotary joints 69 located below all the nozzle elevation shafts 55 by sidewise movement of a piston rod of the second top dead center changing cylinder 61, by which engagement release operations or engagement operations of all the nozzle elevation shafts 55 can be concurrently performed.

For clear comprehension of an engagement operation and engagement release operation, FIG. 6 shows an illustration in which the engagement portions 64 and 63 are each provided by a cut hole instead of a through hole, and a top dead center is regulated by bringing of the engagement portions 64 and 63 into contact with an upper end of rotary joint 69 of nozzle elevation shaft 55 during engagement, as compared with engagement portions leaving the nozzle elevation shaft 55 during non-engagement. However, the way of thinking of the engagement operation and the non-engagement operation is utterly identical to that of the non-engagement through hole portion 63a and the engagement through hole portion 63b.

In FIG. 5, reference numeral 50 denotes a θ-rotation drive motor for adjusting a posture of a component sucked by nozzle 70 by rotating nozzle elevation shaft 55 in a direction of θ around the shaft, 52 denotes a gear fixed to a rotary shaft of the θ-rotation drive motor 50, 53 denotes a θ-rotation gear fixed to a middle portion of each nozzle elevation shaft 55, and 51 denotes a dual-sided cogged belt to be meshed with the θ-rotation gear 53 of each nozzle elevation shaft 55 and the gear 52 of the θ-rotation drive motor 50. Therefore, if the θ-rotation drive motor 50 is driven to rotate, then the θ-rotation gears 53 of all the nozzle elevation shafts 55 are rotated by the dual-sided cogged belt 51 so as to adjust postures of the components sucked by the nozzles 70.

Therefore, posture correction of a component held by a nozzle is performed by rotating the nozzle into a specified angular position via the θ-rotation drive motor 50 driven on a basis of a component recognition result after component recognition and before component placement by virtue of, for example, ten nozzles 70, . . . , 70, and then the component is placed on the board 2. With regard to a subsequent nozzle, posture correction of a component held by this nozzle is similarly performed by rotating the nozzle into a specified angular position with the θ-rotation drive motor 50 driven, and then the component is placed on the board 2. That is, during component recognition, a rotatory position of each component held by each nozzle is recognized, and displacement between the rotary position and a rotary position in each placement position of the board 2 is calculated by the operating section 1002. At this time, if a position of each component during recognition is assumed to be an initial rotary position and a displacement between the initial rotary position and the rotary position in each placement position of the board 2 is only calculated, unless a second nozzle 70 is once set back to an initial position when, for example, a first nozzle 70 corresponding to the first nozzle selection cylinder 45-1 and the other nozzles 70 are concurrently rotated by θ turns from an initial rotary position to a first rotation angle in the placement position, placed on the board 2 and subsequently the second nozzle 70 corresponding to the second nozzle selection cylinder 45-2 is attached, an amount of rotation at the second rotation angle in the placement position of the second nozzle 70 can not be perceived until the second nozzle 70 once returns to the initial position. However, this also increases a mounting tact. Therefore, if a difference between the first rotation angle in the placement position of the first nozzle 70 and the second rotation angle in the placement position of the second nozzle 70 is calculated, then the second nozzle can be turned by θ turn to the second rotation angle without setting the second nozzle back once from the first rotation angle to the initial position, thereby allowing a mounting tact to be further improved.

With this arrangement, the nozzle can be extremely promptly positioned in the rotation angle position by comparison with rotation of each nozzle to a desired angular position after once setting the nozzle back into the initial position. It is more preferable to perform the aforementioned operation immediately after completion of a recognizing operation than during a placing stage in terms of tact reduction.

Likewise, by moving the nozzles by a difference similarly taken in consideration of displacement correction corresponding to an adjacent nozzle placing position with regard to positional displacement correction of the X-Y positions of each nozzle on the basis of a difference in the nozzle arrangement pitch width and a pitch width between the objective placement regions of the boards, the nozzles can be extremely promptly positioned in specified X-Y coordinate positions. Also, in this case, it is preferable to perform the aforementioned operation immediately after completion of the recognizing operation rather than during the placing stage in terms of tact reduction.

According to the aforementioned embodiment, if, when two mounting units are arranged and the operation in either one of the first and second mounting units is performed while fundamentally and independently performing a series of component mounting operations constituted of component holding, component recognition, and component placement, variations and the like of the operation in the other mounting unit exert unfavorable influence on the one mounting unit, then, by executing operational control of the operation in the one mounting unit and operation in the other mounting unit, component recognition or board recognition accuracy can be improved while independently performing the mounting operation of each component and optimizing the mounting operation in each mounting unit without exerting any unfavorable influence of vibrations and the like of the other mounting unit on the operation in the one mounting unit, and productivity per unit area can be improved. As one example, by executing operational control so as not to perform a component placement or component holding operation in the other of the first and second mounting units while a component or board recognizing operation is executed in the one of the first and second mounting units, each component mounting operation is independently performed without exerting any unfavorable influence of vibrations and the like of the component placement or component holding operation in the other mounting unit on the component or board recognizing operation in the one mounting unit. By so doing, component recognition or board recognition accuracy can be improved while optimizing the mounting operation in each mounting unit, and productivity per unit area can be improved.

Moreover, if operational control is executed so as not to perform the component placement or component holding operation in the other of the first and second mounting units while the component or board recognizing operation is performed in the one of the first and second mounting units by accelerating or decelerating an operating speed, in the regions before and after the component placement operation or before and after the component holding operation in the other of the first and second mounting units, to be within a range in which during the component or board recognizing operation in the one of the first and second mounting units no influence is exerted on the component or board recognizing operation, then component recognition or board recognition accuracy can be improved without reducing an overall mounting tact nor exerting unfavorable influence of vibrations and the like of the component placement or component holding operation in the other mounting unit on the component or board recognizing operation in the one mounting unit.

Moreover, if operational control is executed so as not to perform a component placement or component holding operation by stopping operation in the other of the first and second mounting units while a component or board recognizing operation is performed in the one mounting unit, then component recognition or board recognition accuracy can be more reliably improved without exerting unfavorable influence of vibrations and the like of the component placement or component holding operation in the other mounting unit on the component or board recognizing operation in the one mounting unit.

Moreover, if the plurality of component holding members are arranged while being aligned at a pitch interval corresponding to an arrangement pitch of the plurality of component supply members when the plurality of components held by the plurality of component holding members are placed in the plurality of objective placement regions by receiving and holding the components from the plurality of component supply members by virtue of the plurality of component holding members on mounting base objects constituted by connecting the plurality of objective placement regions in which same components are to be placed in same positions in one direction of connection, then the plurality of components from the plurality of component supply members can be concurrently held by the plurality of component holding members, thereby allowing a mounting tact to be improved.

Moreover, by connecting the plurality of objective placement regions of the same shape in the direction of connection of the mounting base objects at a pitch interval corresponding to the arrangement pitch of the plurality of component supply members, and making the head section operate to place the plurality of components held by the plurality of component holding members of the head section in the plurality of objective placement regions while moving relative to the mounting base objects so that the direction of the alignment becomes identical to the connection direction in which the plurality of objective placement regions are connected together, the head section can be more efficiently moved without being largely moved relative to every objective placement region, and a mounting tact can further be improved.

It is to be noted that the present invention is not limited to the aforementioned embodiment, and is able to be put into practice in a variety of other forms.

For example, since the two mounting units MU1 and MU2 are mounted on one main body, it is preferable to secure accuracy by restraining operation in the other mounting unit and reducing influence of vibrations during calibration concerning displacement in the X- and Y-directions of the nozzles or mounting of high-accuracy components mounting such as C4 (Controlled Chip Collapse Connection) mounting, and the like besides the aforementioned recognition. That is, when an operation that requires high accuracy is performed in one mounting unit, it is proper to stop operation of the other mounting unit, reduce speed of the other mounting unit to a speed at which no influence is exerted on accuracy, or perform the operation consistently at a constant speed without accelerating nor decelerating speed of the other mounting unit. At this time, when operation that requires accuracy is ended in one mounting unit, the operation is performed at a speed capable of causing an accelerating or decelerating operation in the other mounting unit. In this regard, since acceleration or deceleration in the other mounting unit becomes a factor of vibration, it is preferable to perform neither an accelerating nor decelerating operation in the other mounting unit if possible.

With this arrangement, by executing operational control so as not to perform a component placement or a component holding operation in the other of the first and second mounting units MU1 and MU2 while a placement operation for placing a high-accuracy component, for example, a C4 component as the aforementioned component, is performed in the one of the first and second mounting units MU1 and MU2, and independently performing each component mounting operation without exerting any unfavorable influence of a component placement or component holding operation in the other mounting unit on the high-accuracy component placement operation in the one mounting unit, component placement accuracy can be improved while optimizing the mounting operation in each mounting unit, and productivity per unit area can be improved. Moreover, if operational control executed so as not to perform a component placement or component holding operation in the other of the first and second mounting units MU1 and MU2, while a component placement operation for placing a high-accuracy component, for example the C4 component as the aforementioned component, is performed in the one of the first and second mounting units MU1 and MU2, by accelerating or decelerating an operating speed in regions, before and after the component placement operation or before and after the component holding operation in the other of the first and second mounting units MU1 and MU2 within a range in which no influence is exerted on the component placement operation during the component placement operation for placing the high-accuracy component, for example the C4 component as the aforementioned component, in the one of the first and second mounting units MU1 and MU2, then component placement accuracy can be improved without reducing an overall mounting tact nor exerting any unfavorable influence of the component mounting or component holding operation in the other mounting unit on the component mounting operation in the one mounting unit. Moreover, if operational control executed so as not to perform a component placement or component holding operation by stopping operation in the other of the first and second mounting units MU1 and MU2 while a placement operation for placing a high-accuracy component, for example the C4 component as the aforementioned component, is performed in the one of the first and second mounting units MU1 and MU2, then component placing accuracy can be more reliably improved without exerting any unfavorable influence of the component placement or component holding operation in the other mounting unit on the component placement operation in the one component mounting unit.

Moreover, if operational control of operation in the one mounting unit and the other mounting unit, when operation in the other mounting unit exerts unfavorable influence on the operation in the one mounting unit while performing the operation in either of the first and second mounting units in the aforementioned embodiment, it is acceptable to execute operational control of the operation in the one mounting unit and the operation in the other mounting unit by decelerating the operation in the other mounting unit by determining whether or not the other mounting unit is decelerating or stopping and determining that the operation is not a decelerating or stopping operation.

Concretely, operational control is executed as follows.

Figure 7:
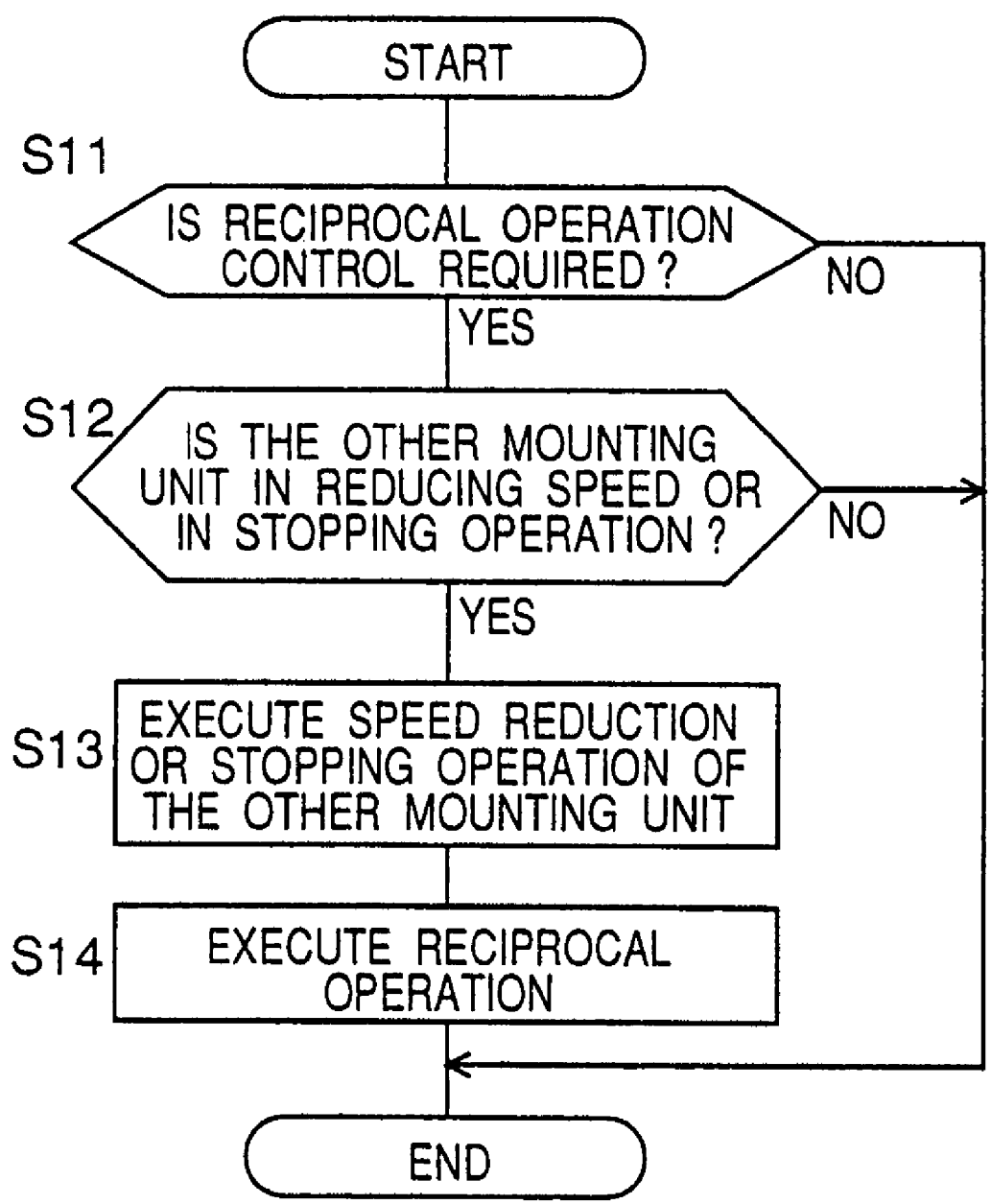
FIG. 7 is a flowchart showing reciprocal operational control in the component mounting apparatus.

That is, a flowchart of a reciprocal operation control routine for decelerating or stopping operation on the second mounting unit MU2 side instead of maintaining a normal speed when board recognition, component recognition, or high-accuracy component placement, for example placement of a C4 (Controlled Collapse Chip Connection) component of a multi-pin narrow-pitch BGA (Ball Grid Array) or a CSP (Chip Sized Package) component, is performed on the first mounting unit MU1 side will be described with reference to FIG. 7.

Here is considered a case of an operation that requires reciprocal operational control such as a board recognition, component recognition, or high-accuracy placement operation of a high-accuracy component, for example the C4 component, performed on, for example, the first mounting unit MU1 side. When performing an operation that requires the reciprocal operational control such as the board recognition, the component recognition, or the high-accuracy placement operation of the high-accuracy component, for example the C4 component, on the second mounting unit MU2 side, it is proper to read the first mounting unit MU1 as the second mounting unit MU2 and read the second mounting unit MU2 as the first mounting unit MU1 in substitution in the following operation.

First of all, it is determined in step S11 whether or not an operation to be executed in the first mounting unit MU1 is an operation that requires reciprocal operational control such as a board recognition, component recognition, or high accuracy placement operation of a high-accuracy component, for example the C4 component. If the operation is not an operation that requires reciprocal operational control, then the operation is performed.

If the operation is an operation that requires reciprocal operational control, it is determined in step S12 whether or not the second mounting unit MU2 is in a decelerating or stopping operation. If the second mounting unit MU2 is in a decelerating or stopping operation, then the board recognition, the component recognition, or the high-accuracy placement operation of the high-accuracy component, for example the C4 component, is made to stand by in order to continue the operation, and an end of the decelerating or stopping operation in the second mounting unit MU2 is awaited. That is, this reciprocal operational control routine is ended once, and step S11 and step S12 are executed again.

Next, if the second mounting unit MU2 is not in a decelerating or stopping operation, but is in a normal-speed operation in step S13, then a request for the decelerating or stopping operation is issued to the second mounting unit MU2.

That is, the decelerating or stopping operation of a moving device or member that is moving at the normal speed is performed in the second mounting unit MU2. Concretely, for example, a moving speed of the mounting head is decelerated or the mounting head is stopped in one of a position located above a suction position, a recognition position, and a position located above a placement position.

Next, an operation that requires reciprocal operational control such as a board recognition, component recognition, or high-accuracy placement operation of a high-accuracy component, for example the C4 component, is performed in the first mounting unit MU1 in step S14.

A control operation of a reciprocal operation can be executed as described above.

When performing a control operation of such a reciprocal operation in the control unit 1000 as one example, the operation is performed by the reciprocal operation control section 1000B and the individual operation control section 1000A of the control unit 1000. That is, the control unit 1000 is provided with the individual operation control section 1000A for executing operational control of the mounting units MU1 and MU2, and the reciprocal operation control section 1000B for controlling reciprocal operation in both the mounting units MU1 and MU2. The individual operation control section 1000A is constructed of a first individual operational control section 1000A-1 for executing operational control of the first mounting unit MU1 and a second individual operation control section 1000A-2 for executing operation control of the second mounting unit MU2. In practice, the first individual operation control section 1000A-1 and the second individual operation control section 1000A-2 may be provided inside the first mounting unit MU1 and the second mounting unit MU2, respectively.

First of all, it is determined by virtue of the reciprocal operation control section 1000B in step S11 whether or not an operation to be performed in the first mounting unit MU1 is an operation that requires reciprocal operational control such as a board recognition, component recognition, or high-accuracy placement operation of a high-accuracy component, for example the C4 component. If the operation is not an operation that requires reciprocal operational control, then the operation is performed under control of the first individual operation control section 1000A-1 of the first mounting unit MU1.

If the operation is an operation that requires reciprocal operational control, then it is determined in step S12 whether or not the second mounting unit MU2 is in a decelerating or stopping operation by referring to an operational control state of the second individual operation control section 1000A-2 by virtue of the reciprocal operation control section 1000B. If the second mounting unit MU2 is in the decelerating or stopping operation, then the first individual operation control section 1000A-1 is controlled so as to cause the board recognition, the component recognition, or the high-accuracy placing operation of the high-accuracy component, for example the C4 component, in the first mounting unit MU1 to stand-by by virtue of the reciprocal operation control section 1000B in order to continue the operation, and an end of the decelerating or stopping operation in the second mounting unit MU2 is awaited. That is, this reciprocal operational control routine is ended once, and step S11 and step S12 are executed again.

Next, if the second mounting unit MU2 is not in a decelerating or stopping operation but in a normal operation in step S13, then a request for the decelerating or stopping operation is issued from the reciprocal operation control section 1000B to the second individual operation control section 1000A-2 of the second mounting unit MU2.

Next, in step S14, the second individual operation control section 1000A-2 that has received a request for the decelerating or stopping operation controls the second mounting unit MU2 so as to perform the decelerating or stopping operation of a moving device or member during operation. Concretely, for example, a moving speed of the mounting head is decelerated or the mounting head is stopped in one of a position located above a suction position, a recognition position, and a position located above a placement position. As described above, after confirming that the reciprocal operation control section 1000B receives a confirmation signal, of an event that the decelerating or stopping operation is being or has been performed in the second mounting unit MU2, from the second individual operation control section 1000A-2 or confirming that the second individual operation control section 1000A-2 has received a decelerating or stopping operation request signal, an operation start permit signal that requires reciprocal operational control is transmitted from the reciprocal operation control section 1000B to the first individual operation control section 1000A-1, and the operation that requires the reciprocal operational control such as the board recognition, the component recognition, or the high-accuracy placement operation of the high-accuracy component, for example the C4 component, is performed in the first mounting unit MU1 under control of the first individual operation control section 1000A-1.

If a case of an operation that requires reciprocal operational control such as a board recognition, component recognition, or high-accuracy placement operation of a high-accuracy component, for example the C4 component, on the first mounting unit MU1 side, and a case of an operation that requires reciprocal operational control such as a board recognition, component recognition, or high-accuracy placement operation of the high-accuracy component, for example the C4 component, on the second mounting unit MU2 side, occur roughly at the same time, it is acceptable to give preference to either mounting unit predetermined as occasion demands.

When a moving operation speed of, for example, the head is decelerated in the aforementioned embodiment, an operating speed ratio is reduced for deceleration by about 48% when a deceleration speed is set to 1.17 m/s when a normal speed is 24.5 m/s during a recognizing operation, according to one example. During a mounting operation of a high-accuracy component such as the C4 component, a deceleration speed is set to 0.58 m/s for deceleration by about 24% when a normal speed is 2.45 m/s, according to one example.

Moreover, regarding timing of issuing a request for a decelerating or stopping operation, the request for the decelerating or stopping operation before a board mark recognition is issued prior to start of movement of the head in the X- and Y-directions. The request for the decelerating or stopping operation before the component recognition is issued during descent of a nozzle or prior to movement of a corresponding head in the X-direction. The request for the decelerating or stopping operation before descent for placement is issued prior to descent of the nozzle. In addition, the request for the decelerating or stopping operation before recognition for calibration may be properly issued prior to movement of the head in the X-direction.

According to the present invention, when operation in either one of the first and second mounting units is performed while arranging the two mounting units and fundamentally and independently performing a series of component mounting operations constituted of component holding, component recognition, and component placement, by executing operational control of an operation in one mounting unit and operation in the other mounting unit, if variations and the like of the operation in the other mounting unit exert unfavorable influence on the operation in the one mounting unit, component placement, component recognition, or board recognition accuracy can be improved while independently performing each component mounting operation and optimizing the mounting operation in each mounting unit without exerting any unfavorable influence of the operation in the other mounting unit on the operation in the one mounting unit, and productivity per unit area can be improved.

Moreover, while the component or board recognizing operation is executed in either one of the first and second mounting units, by executing operational control so as not to perform a component placement or component holding operation in the other of the first and second mounting units, each component mounting operation is independently performed without exerting any unfavorable influence of vibrations and the like of the component placement or component holding operation in the other mounting unit on the component or board recognizing operation in the one mounting unit. By so doing, component recognition or board recognition accuracy can be improved while optimizing the mounting operation in each mounting unit, and productivity per unit area can be improved.

Moreover, if, while the component or board recognizing operation is performed in either one of the first and second mounting units, operational control is executed so as not to perform a component placement or component holding operation in the other of the first and second mounting units by accelerating or decelerating an operating speed in regions before and after the component placement operation or before and after the component holding operation in the other of the first and second mounting units within a range in which no influence is exerted on the component or board recognizing operation during the component or board recognizing operation in the one of the first and second mounting units, then component recognition or board recognition accuracy can be improved without reducing an overall mounting tact nor exerting unfavorable influence of vibrations and the like of the component placement or component holding operation in the other mounting unit on the component or board recognizing operation in the one mounting unit.

Moreover, while the component or board recognizing operation is performed in either one of the first and second mounting units, if operational control is executed so as not to perform a component placement or component holding operation by stopping operation in the other of the first and second mounting units, then component recognition or board recognition accuracy can be more reliably improved without exerting unfavorable influence of vibrations and the like of the component placement or component holding operation in the other mounting unit on the component or board recognizing operation in the one mounting unit.

Moreover, while the placement operation for placing the C4 component as the aforementioned component is performed in either one of the first and second mounting units, by executing operational control so as not to perform a component placement or component holding operation in the other of the first and second mounting units and independently performing each component mounting operation without exerting any unfavorable influence of vibrations and the like of the component placement or component holding operation in the other mounting unit on a high-accuracy component placement operation in the one mounting unit, component placement accuracy can be improved while optimizing the mounting operation in each mounting unit, and productivity per unit area can be improved.

Moreover, while a component placement operation for placing the C4 component as the aforementioned component is performed in either one of the first and second mounting units, if operational control is executed so as not to perform a component placement or component holding operation in the other of the first and second mounting units by accelerating or decelerating an operating speed in regions before and after the component placement operation or before and after the component holding operation in the other of the first and second mounting units within a range in which no influence is exerted on the component placement operation during the component placement operation for placing the C4 component as the aforementioned component in the one of the first and second mounting units, then component placement accuracy can be improved without reducing an overall mounting tact nor exerting any unfavorable influence of vibrations and the like of the component placement or component holding operation in the other mounting unit on the component placing operation in the one mounting unit.

Moreover, while a placement operation for placing the C4 component as the aforementioned component is performed in either one of the first and second mounting units, if operational control is executed so as not to perform a component placement or component holding operation by stopping operation in the other of the first and second mounting units, then component placement accuracy can be more reliably improved without exerting any unfavorable influence of vibrations and the like of the component placement or component holding operation in the other mounting unit on the component placement operation in the one component mounting unit.

Moreover, if the plurality of component holding members are arranged while being aligned at a pitch interval corresponding to an arrangement pitch of the plurality of component supply members when the plurality of components held by the plurality of component holding members are placed in the plurality of objective placement regions by receiving and holding the components from the plurality of component supply members by virtue of the plurality of component holding members on the mounting base objects constituted by connecting a plurality of objective placement regions in which the same components are to be placed in the same positions in one direction of connection, then the plurality of components received from the plurality of component supply members can be concurrently held by the plurality of component holding members, thereby allowing a mounting tact to be improved.

Moreover, by connecting the plurality of objective placement regions of the same shape in the direction of the connection of the mounting base objects at a pitch interval corresponding to the arrangement pitch of the plurality of component supply members, and moving the head section to the mounting base objects to place the plurality of components held by the plurality of component holding, members of the head section in the plurality of objective placement regions so that a direction of the alignment becomes identical to the connection direction in which the plurality of objective placement regions are connected together, the head section can be more efficiently moved without being largely moved relative to every objective placement region, and a mounting tact can further be improved.

It is to be noted that, by appropriately combining arbitrary embodiments out of the aforementioned various embodiments, effects owned by the embodiments can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A component mounting method comprising:
    using a first mounting unit in a first mounting region to perform first operations of
        (i) loading of a first mounting base object into a first mounting base object holding device,
        (ii) holding of said first mounting base object by said first mounting base object holding device, then
        (iii) holding of a component by a first component holding member,
        (iv) recognition of said first component while held by said first component holding member, and
        (v) placement of said first component, while held by said first component holding member, on said first mounting base object;
    concurrently with performing said first operations of (i)-(v), using a second mounting unit in a second mounting region to perform second operations of
        (vi) loading of a second mounting base object into a second mounting base object holding device,
        (vii) holding of said second mounting base object by said second mounting base object holding device, then
        (viii) holding of a second component by a second component holding member,
        (ix) recognition of said second component while held by said second component holding member, and
        (x) placement of said second component, while held by said second component holding member, on said second mounting base object;
    executing operational control of said first and second mounting units;
    while executing said operational control of said first and second mounting units, determining, when one of said first operations is performed, whether a speed of one of said second operations is decreasing or stopping and, if the speed of said one of said second operations is not decreasing or stopping, executing said operational control of said first and second mounting units such that the speed of said one of said second operations is caused to decrease; and
    while component recognition is performed by said second mounting unit in said second mounting region, executing said operational control of said first and second mounting units such that component placement or component holding is not performed by said first mounting unit in said first mounting region,
    wherein said first and second mounting regions are obtained by dividing a component mounting work region, with said first and second mounting regions being on opposite sides of a path through which mounting base objects are to be conveyed.

2. The component mounting method according to claim 1, wherein
    using said second mounting unit to perform said loading of a second mounting base object into a second mounting base object holding device comprises using said second mounting unit to load said second mounting base object into said second mounting base object holding device via said first mounting region, or
    using said first mounting unit to perform said loading of a first mounting base object into a first mounting base object holding device comprises using said first mounting unit to load said first mounting base object into said first mounting base object holding device via said second mounting region.

3. A component mounting method comprising:
    using a first mounting unit in a first mounting region to perform first operations of
        (i) loading of a first mounting base object into a first mounting base object holding device,
        (ii) holding of said first mounting base object by said first mounting base object holding device, then
        (iii) holding of a component by a first component holding member,
        (iv) recognition of said first component while held by said first component holding member, and
        (v) placement of said first component, while held by said first component holding member, on said first mounting base object;
    concurrently with performing said first operations of (i)-(v), using a second mounting unit in a second mounting region to perform second operations of
        (vi) loading of a second mounting base object into a second mounting base object holding device,
        (vii) holding of said second mounting base object by said second mounting base object holding device, then
        (viii) holding of a second component by a second component holding member,
        (ix) recognition of said second component while held by said second component holding member, and
        (x) placement of said second component, while held by said second component holding member, on said second mounting base object;
    executing operational control of said first and second mounting units;
    while executing said operational control of said first and second mounting units, determining, when one of said first operations is performed, whether a speed of one of said second operations is decreasing or stopping and, if the speed of said one of said second operations is not decreasing or stopping, executing said operational control of said first and second mounting units such that the speed of said one of said second operations is caused to decrease; and
    while mounting base object recognition is performed by said second mounting unit in said second mounting region, executing said operational control of said first and second mounting units such that component placement or component holding is not performed by said first mounting unit in said first mounting region,
    wherein said first and second mounting regions are obtained by dividing a component mounting work region, with said first and second mounting regions being on opposite sides of a path through which mounting base objects are to be conveyed.

4. The component mounting method according to claim 3, wherein
- using said second mounting unit to perform said loading of a second mounting base object into a second mounting base object holding device comprises using said second mounting unit to load said second mounting base object into said second mounting base object holding device via said first mounting region, or
- using said first mounting unit to perform said loading of a first mounting base object into a first mounting base object holding device comprises using said first mounting unit to load said first mounting base object into said first mounting base object holding device via said second mounting region.

5. A component mounting method comprising:
- using a first mounting unit in a first mounting region to perform first operations of
  - (i) loading of a first mounting base object into a first mounting base object holding device,
  - (ii) holding of said first mounting base object by said first mounting base object holding device, then
  - (iii) holding of a component by a first component holding member,
  - (iv) recognition of said first component while held by said first component holding member, and
  - (v) placement of said first component, while held by said first component holding member, on said first mounting base object;
- concurrently with performing said first operations of (i)-(v), using a second mounting unit in a second mounting region to perform second operations of
  - (vi) loading of a second mounting base object into a second mounting base object holding device,
  - (vii) holding of said second mounting base object by said second mounting base object holding device, then
  - (viii) holding of a second component by a second component holding member,
  - (ix) recognition of said second component while held by said second component holding member, and
  - (x) placement of said second component, while held by said second component holding member, on said second mounting base object;
- executing operational control of said first and second mounting units;
- while executing said operational control of said first and second mounting units, determining, when one of said first operations is performed, whether a speed of one of said second operations is decreasing or stopping and, if the speed of said one of said second operations is not decreasing or stopping, executing said operational control of said first and second mounting units such that the speed of said one of said second operations is caused to decrease; and
- while component recognition is performed by said second mounting unit in said second mounting region, executing said operational control of said first and second mounting units such that component placement or component holding is not performed by said first mounting unit in said first mounting region, by increasing or decreasing a speed of one of said first operations, before and after component placement or before and after component holding is performed by said first mounting unit in said first mounting region, to within a range whereby no influence is exerted on the component recognition performed by said second mounting unit in said second mounting region, wherein said first and second mounting regions are obtained by dividing a component mounting work region, with said first and second mounting regions being on opposite sides of a path through which mounting base objects are to be conveyed.

6. The component mounting method according to claim 5, wherein
- using said second mounting unit to perform said loading of a second mounting base object into a second mounting base object holding device comprises using said second mounting unit to load said second mounting base object into said second mounting base object holding device via said first mounting region, or
- using said first mounting unit to perform said loading of a first mounting base object into a first mounting base object holding device comprises using said first mounting unit to load said first mounting base object into said first mounting base object holding device via said second mounting region.

7. A component mounting method comprising:
- using a first mounting unit in a first mounting region to perform first operations of
  - (i) loading of a first mounting base object into a first mounting base object holding device,
  - (ii) holding of said first mounting base object by said first mounting base object holding device, then
  - (iii) holding of a component by a first component holding member,
  - (iv) recognition of said first component while held by said first component holding member, and
  - (v) placement of said first component, while held by said first component holding member, on said first mounting base object;
- concurrently with performing said first operations of (i)-(v), using a second mounting unit in a second mounting region to perform second operations of
  - (vi) loading of a second mounting base object into a second mounting base object holding device,
  - (vii) holding of said second mounting base object by said second mounting base object holding device, then
  - (viii) holding of a second component by a second component holding member,
  - (ix) recognition of said second component while held by said second component holding member, and
  - (x) placement of said second component, while held by said second component holding member, on said second mounting base object;
- executing operational control of said first and second mounting units;
- while executing said operational control of said first and second mounting units, determining, when one of said first operations is performed, whether a speed of one of said second operations is decreasing or stopping and, if the speed of said one of said second operations is not decreasing or stopping, executing said operational control of said first and second mounting units such that the speed of said one of said second operations is caused to decrease; and
- while component recognition is performed by said second mounting unit in said second mounting region, executing said operational control of said first and second mounting units such that component placement or component holding is not performed by said first mounting unit in said first mounting region by stopping one of said first operations, wherein said first and second mounting regions are obtained by dividing a component mounting work region, with said first and second mounting regions being on opposite sides of a path through which mounting base objects are to be conveyed.

8. The component mounting method according to claim 7, wherein
using said second mounting unit to perform said loading of a second mounting base object into a second mounting base object holding device comprises using said second mounting unit to load said second mounting base object into said second mounting base object holding device via said first mounting region, or
using said first mounting unit to perform said loading of a first mounting base object into a first mounting base object holding device comprises using said first mounting unit to load said first mounting base object into said first mounting base object holding device via said second mounting region.

9. A component mounting method comprising:
using a first mounting unit in a first mounting region to perform first operations of
  (i) loading of a first mounting base object into a first mounting base object holding device,
  (ii) holding of said first mounting base object by said first mounting base object holding device, then
  (iii) holding of a component by a first component holding member,
  (iv) recognition of said first component while held by said first component holding member, and
  (v) placement of said first component, while held by said first component holding member, on said first mounting base object;
concurrently with performing said first operations of (i)-(v), using a second mounting unit in a second mounting region to perform second operations of
  (vi) loading of a second mounting base object into a second mounting base object holding device,
  (vii) holding of said second mounting base object by said second mounting base object holding device, then
  (viii) holding of a second component by a second component holding member,
  (ix) recognition of said second component while held by said second component holding member, and
  (x) placement of said second component, while held by said second component holding member, on said second mounting base object;
executing operational control of said first and second mounting units;
while executing said operational control of said first and second mounting units, determining, when one of said first operations is performed, whether a speed of one of said second operations is decreasing or stopping and, if the speed of said one of said second operations is not decreasing or stopping, executing said operational control of said first and second mounting units such that the speed of said one of said second operations is caused to decrease; and
after concurrently performing said first operations of (i)-(v) and said second operations of (vi)-(x),
  (a) loading said first mounting base object into said second mounting region, and then mounting another second component onto said first mounting base object, or (b) loading said second mounting base object into said first mounting region, and then mounting another first component onto said second mounting base object,
wherein said first and second mounting regions are obtained by dividing a component mounting work region, with said first and second mounting regions being on opposite sides of a path through which mounting base objects are to be conveyed.

10. The component mounting method according to claim 9, wherein
using said second mounting unit to perform said loading of a second mounting base object into a second mounting base object holding device comprises using said second mounting unit to load said second mounting base object into said second mounting base object holding device via said first mounting region, or
using said first mounting unit to perform said loading of a first mounting base object into a first mounting base object holding device comprises using said first mounting unit to load said first mounting base object into said first mounting base object holding device via said second mounting region.

11. A component mounting method comprising:
using a first mounting unit in a first mounting region to perform first operations of
  (i) loading of a first mounting base object into a first mounting base object holding device,
  (ii) holding of said first mounting base object by said first mounting base object holding device, then
  (iii) holding of a component by a first component holding member,
  (iv) recognition of said first component while held by said first component holding member, and
  (v) placement of said first component, while held by said first component holding member, on said first mounting base object;
concurrently with performing said first operations of (i)-(v), using a second mounting unit in a second mounting region to perform second operations of
  (vi) loading of a second mounting base object into a second mounting base object holding device,
  (vii) holding of said second mounting base object by said second mounting base object holding device, then
  (viii) holding of a second component by a second component holding member,
  (ix) recognition of said second component while held by said second component holding member, and
  (x) placement of said second component, while held by said second component holding member, on said second mounting base object;
executing operational control of said first and second mounting units;
while executing said operational control of said first and second mounting units, determining, when one of said first operations is performed, whether a speed of one of said second operations is decreasing or stopping and, if the speed of said one of said second operations is not decreasing or stopping, executing said operational control of said first and second mounting units such that the speed of said one of said second operations is caused to decrease; and
after concurrently performing said first operations of (i)-(v) and said second operations of (vi)-(x),
  (a) unloading said second mounting base object from said second mounting region and unloading said first mounting base object through and from said second mounting region, then loading another second mounting base object into said second mounting region via said first mounting region and loading another first mounting base object into said first mounting region, and then mounting a component onto each of said another first mounting base object and said another second mounting base object, or (b) unloading said first mounting base object from said first mounting region and unloading said second mounting base object through and from said first mounting region, then loading another first mounting base object into said first mounting region via said second mounting region and loading another second mounting base object into said second mounting region, and then mounting a component onto each of said another second mounting base object and said another first mounting base object, wherein said first and second mounting regions are obtained by dividing a component mounting work region, with said first and second mounting regions being on opposite sides of a path through which mounting base objects are to be conveyed.

12. The component mounting method according to claim 11, wherein using said second mounting unit to perform said loading of a second mounting base object into a second mounting base object holding device comprises using said second mounting unit to load said second mounting base object into said second mounting base object holding device via said first mounting region, or using said first mounting unit to perform said loading of a first mounting base object into a first mounting base object holding device comprises using said first mounting unit to load said first mounting base object into said first mounting base object holding device via said second mounting region.

13. A component mounting method comprising:

using a first mounting unit in a first mounting region to perform first operations of
  (i) loading of a first mounting base object into a first mounting base object holding device,
  (ii) holding of said first mounting base object by said first mounting base object holding device, then
  (iii) holding of a component by a first component holding member,
  (iv) recognition of said first component while held by said first component holding member, and
  (v) placement of said first component, while held by said first component holding member, on said first mounting base object;

concurrently with performing said first operations of (i)-(v), using a second mounting unit in a second mounting region to perform second operations of
  (vi) loading of a second mounting base object into a second mounting base object holding device,
  (vii) holding of said second mounting base object by said second mounting base object holding device, then
  (viii) holding of a second component by a second component holding member,
  (ix) recognition of said second component while held by said second component holding member, and
  (x) placement of said second component, while held by said second component holding member, on said second mounting base object;

executing operational control of said first and second mounting units; and while executing said operational control of said first and second mounting units, determining, when one of said first operations is performed, whether a speed of one of said second operations is decreasing or stopping and, if the speed of said one of said second operations is not decreasing or stopping, executing said operational control of said first and second mounting units such that the speed of said one of said second operations is caused to decrease, wherein said first mounting unit includes a first head section having first component holding members and a first component supplying device having first component supply members, and said second mounting unit includes a second head section having second component holding members and a second component supplying device having second component supply members, with said method further comprising:

(a) in said first mounting region
  (i) with said first component holding members aligned at a pitch interval corresponding to an arrangement pitch of said first component supply members, concurrently holding first components supplied from said first component supply members, respectively, by said first component holding members, respectively, and
  (ii) placing said first components, while held by said first component holding members, at same positions on identically shaped objective placement regions of said first mounting base object while held by said first mounting base object holding device, with said identically shaped objective placement regions of said first mounting base object being connected together in a direction of connection at a pitch interval corresponding to said arrangement pitch of said first component supply members, after moving said first head section relative to said first mounting base object such that a direction in which said first component holding members are aligned becomes identical to the direction of connection of said identically shaped objective placement regions of said first mounting base object; and (b) in said second mounting region
  (i) with said second component holding members aligned at a pitch interval corresponding to an arrangement pitch of said second component supply members, concurrently holding second components supplied from said second component supply members, respectively, by said second component holding members, respectively, and
  (ii) placing said second components, while held by said second component holding members, at same positions on identically shaped objective placement regions of said second mounting base object while held by said second mounting base object holding device, with said identically shaped objective placement regions of said second mounting base object being connected together in a direction of connection at a pitch interval corresponding to said arrangement pitch of said second component supply members, after moving said second head section relative to said second mounting base object such that a direction in which said second component holding members are aligned becomes identical to the direction of connection of said identically shaped objective placement regions of said second mounting base object, wherein said first and second mounting regions are obtained by dividing a component mounting work region, with said first and second mounting regions being on opposite sides of a path through which mounting base objects are to be conveyed.

14. The component mounting method according to claim 13, wherein using said second mounting unit to perform said loading of a second mounting base object into a second mounting base object holding device comprises using said second mounting unit to load said second mounting base object into said second mounting base object holding device via said first mounting region, or using said first mounting unit to perform said loading of a first mounting base object into a first mounting base object holding device comprises using said first mounting unit to load said first mounting base object into said first mounting base object holding device via said second mounting region.

* * * * *